(12) United States Patent
Stanley

(10) Patent No.: US 7,521,936 B2
(45) Date of Patent: Apr. 21, 2009

(54) DIAGNOSTIC SYSTEM FOR POWER CONVERTER

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 35 days.

(21) Appl. No.: 11/634,597

(22) Filed: Dec. 5, 2006

(65) Prior Publication Data

US 2007/0153780 A1 Jul. 5, 2007

Related U.S. Application Data

(60) Provisional application No. 60/742,762, filed on Dec. 6, 2005.

(51) Int. Cl.
*G01R 31/08* (2006.01)

(52) U.S. Cl. .......................... 324/522; 307/149; 381/55; 323/280; 330/2

(58) Field of Classification Search ................. 324/522; 330/2; 381/58
See application file for complete search history.

(56) References Cited

U.S. PATENT DOCUMENTS

| | | | |
|---|---|---|---|
| 3,989,908 A | 11/1976 | Budrys et al. | |
| 4,061,891 A | 12/1977 | Pommer | |
| 4,313,064 A | 1/1982 | Claude | |
| 4,574,266 A | 3/1986 | Valentine | |
| 4,884,033 A | 11/1989 | McConchie Sr. | |
| 4,962,350 A | 10/1990 | Fukuda | |
| 4,978,926 A | 12/1990 | Zerod et al. | |
| 5,108,335 A | 4/1992 | Carey et al. | |
| 5,173,832 A | 12/1992 | Giorgetta et al. | |
| 5,294,890 A | 3/1994 | Hemminger et al. | |
| 5,311,138 A | 5/1994 | Ott et al. | |
| 5,361,305 A | 11/1994 | Easley et al. | |
| 5,450,624 A * | 9/1995 | Porambo et al. | 455/226.4 |
| 5,467,240 A | 11/1995 | Williamson et al. | |
| 5,570,259 A | 10/1996 | Allmeier et al. | |
| 5,623,254 A | 4/1997 | Brambilla et al. | |
| 5,886,510 A | 3/1999 | Crespi et al. | |
| 5,896,057 A | 4/1999 | Chicca et al. | |
| 5,920,452 A | 7/1999 | Sullivan | |
| 5,940,518 A | 8/1999 | Augustyn et al. | |
| 6,195,763 B1 | 2/2001 | Mayer et al. | |

(Continued)

FOREIGN PATENT DOCUMENTS

EP 1 465 313 A1 10/2004

*Primary Examiner*—Timothy J Dole
*Assistant Examiner*—Benjamin M Baldridge
(74) *Attorney, Agent, or Firm*—Brinks Hofer Gilson & Lione

(57) ABSTRACT

A power converter system that includes a diagnostic system is presented. One example of a power converter system is an audio amplifier system, such as a switch mode amplifier. The diagnostic system in the power converter may collect data indicative of signals in the power converter system and analyze the collected data. The collection and analysis of the data may be user defined (such as multiple measurements taken over a predetermined period) or may be defined by operation of the power converter system (such as an overcurrent or voltage clipping in the power converter system). The analysis of the collected data may be used to determine one or more potential problems in the power converter system, and to modify operation of the power converter system.

36 Claims, 22 Drawing Sheets

U.S. PATENT DOCUMENTS

| | | |
|---|---|---|
| 6,226,602 B1 | 5/2001 | Schmitt et al. |
| 6,459,175 B1 * | 10/2002 | Potega .................. 307/149 |
| 6,504,348 B2 * | 1/2003 | Stanley .................. 323/280 |
| 6,507,198 B1 | 1/2003 | Streib |
| 6,577,737 B1 * | 6/2003 | Krochmal et al. ............ 381/55 |
| 6,615,120 B1 | 9/2003 | Rother |
| 6,812,715 B2 | 11/2004 | Chiozzi et al. |
| 7,043,027 B2 | 5/2006 | Wood .................. 381/58 |
| 2005/0088225 A1 * | 4/2005 | Louis et al. .................. 330/2 |

\* cited by examiner

ACQUISITION CONTROL REGISTER (WRITE REGISTER)
310

| MUX_CLK1 | MUX_CLK0 | LPF | - | MUX_A3 | MUX_A2 | MUX_A1 | MUX_A0 |
|---|---|---|---|---|---|---|---|

BIT 7                                                                                          BIT 0

BIT 7,6 – SELECTS THE SAMPLING FREQUENCY OF THE DATA ACQUISITION SYSTEM (DAS).
BIT 5   – ENABLES (50KHz) LOW-PASS FILTER FOR INCOMING DATA FROM THE ANALOG MULTIPLEXER.
              0 – DISABLES/BYPASSES LPF
              1 – ENABLES LPF AND AUTOMATIC DELAY (<100uS) TO FIRST SAMPLING
BIT 4   – NOT USED (NU).
BIT 3:0 – ADDRESS SELECTION FOR ANALOG MULTIPLEXER.

| ACQ_CNT7 | ACQ_CNT6 | ACQ_CNT5 | ACQ_CNT4 | ACQ_CNT3 | ACQ_CNT2 | ACQ_CNT1 | ACQ_CNT0 |
|---|---|---|---|---|---|---|---|

BIT 15                                                                                         BIT 8

| ACQ_CNT15 | ACQ_CNT14 | ACQ_CNT13 | ACQ_CNT12 | ACQ_CNT11 | ACQ_CNT10 | ACQ_CNT9 | ACQ_CNT8 |
|---|---|---|---|---|---|---|---|

BIT 23                                                                                         BIT 16

| - | - | ACQ_CNT21 | ACQ_CNT20 | ACQ_CNT19 | ACQ_CNT18 | ACQ_CNT17 | ACQ_CNT16 |
|---|---|---|---|---|---|---|---|

BIT 31                                                                                         BIT 24

BITS 31,30 – NU.
BIT 29:8     – ACQUISITION BURST COUNT USED TO SPECIFY THE BURST LENGTH OF THE DATA
                      SAMPLING. WRITE A NON-ZERO BURST COUNT TO THIS PORTION OF THE REGISTER TO
                      START THE DATA ACQUISITION.

Figure 4

ACQUISITION CONTROL REGISTER (WRITE REGISTER)
310

| MUX_CLK1 | MUX_CLK0 | LPF | - | MUX_A3 | MUX_A2 | MUX_A1 | MUX_A0 |
|---|---|---|---|---|---|---|---|

BIT 7                                                                                                                          BIT 0

| ACQ_CNT7 | ACQ_CNT6 | ACQ_CNT5 | ACQ_CNT4 | ACQ_CNT3 | ACQ_CNT2 | ACQ_CNT1 | ACQ_CNT0 |
|---|---|---|---|---|---|---|---|

BIT 15                                                                                                                         BIT 8

| ACQ_CNT15 | ACQ_CNT14 | ACQ_CNT13 | ACQ_CNT12 | ACQ_CNT11 | ACQ_CNT10 | ACQ_CNT9 | ACQ_CNT8 |
|---|---|---|---|---|---|---|---|

BIT 23                                                                                                                        BIT 16

| - | - | ACQ_CNT21 | ACQ_CNT20 | ACQ_CNT19 | ACQ_CNT18 | ACQ_CNT17 | ACQ_CNT16 |
|---|---|---|---|---|---|---|---|

BIT 31                                                                                                                        BIT 24

BIT 0:3 – ADDRESS SELECTION FOR ANALOG MULTIPLEXER

BIT 4   – UNIMPLEMENTED.

BIT 5   – ENABLES 50KHz LOW-PASS FILTER FOR INCOMING DATA FROM THE ANALOG MULTIPLEXER.
                    0 – DISABLES LPF
                    1 – ENABLES LPF

BIT 6:7 – SELECTS THE SAMPLING FREQUENCY OF THE DAS.

BIT 8:29 – ACQUISITION COUNT REGISTER USED TO SPECIFY THE DESIRED LENGTH OF
    THE DATA SAMPLING. WRITE TO THIS REGISTER TO START THE DATA ACQUISITION.

BIT 30:31 – UNIMPLEMENTED.

Figure 5

ACQUISITION CONTROL MODE REGISTER
170

| EA_SD_CH2 | EA_SD_CH1 | OC_SDS_CH2 | OC_SDS_CH1 | DTO_CH2_1 | DTO_CH2_0 | DTO_CH1_1 | DTO_CH1_0 |
|---|---|---|---|---|---|---|---|

BIT 7                                                                                       BIT 0

| FREQ0 | PHASE6 | PHASE5 | PHASE4 | PHASE3 | PHASE2 | PHASE1 | PHASE0 |
|---|---|---|---|---|---|---|---|

BIT 15                                                                          BIT 8

| UV1 | UV0 | DLY_TMR0 | DLY_TMR0 | DLY_TMR0 | DLY_TMR0 | DLY_TMR0 | FREQ1 |
|---|---|---|---|---|---|---|---|

BIT 23                                                                       BIT 16

|  |  |  |  | TS2_CH2 | TS2_CH1 | TS1_CH2 | TS1_CH1 |
|---|---|---|---|---|---|---|---|

BIT 31                                                                       BIT 24

BIT 0:3   –  DYNAMIC TIME OFFSET CHX.
               – 00 AUTO
               – 10 ON
               – X1 OFF

BIT 4:5   –  OVER CURRENT SHUTDOWN SELECT CHX.

BIT 6:7   –  ERROR AMPLIFIER SHUTDOWN CHX.

BIT 8:14 –  CLOCK PHASE SETTING. 000000 IS THE ZERO PHASE SETTING.

BIT 15:16 – OSCILLATOR FREQUENCY SETTING. F= MASTER / $2^N$.

BIT 17:21 – DELAY TIMER. 000000 IS FULL TURN ON DELAY SETTING.
               – APPROX. 4.2s FOR 250KHz CLOCK
               – APPROX. 65ms PER STEP IN COUNTER.

BIT 24:27 – OVERTEMPERATURE SHUTDOWN SENSOR ASSIGNMENT.
               – 1001 = ASSIGNS TEMP SENSOR #1 TO CH1 AND TEMP SENSOR #2 TO CH2
               – 0110 = ASSIGNS TEMP SENSOR #2 TO CH1 AND TEMP SENSOR #1 TO CH2

Figure 6

ACQUISITION MAX/MIN DATA REGISTER (READ REGISTER)
170

| MIN_DATA1 | MIN_DATA0 | BLANK | BLANK | BLANK | BLANK | BLANK | BLANK |
|---|---|---|---|---|---|---|---|

BIT 7          BIT 0

| MIN_DATA9 | MIN_DATA8 | MIN_DATA7 | MIN_DATA6 | MIN_DATA5 | MIN_DATA4 | MIN_DATA3 | MIN_DATA2 |
|---|---|---|---|---|---|---|---|

BIT 15          BIT 8

| MAX_DATA1 | MAX_DATA0 | BLANK | BLANK | BLANK | BLANK | BLANK | BLANK |
|---|---|---|---|---|---|---|---|

BIT 23          BIT 16

| MAX_DATA9 | MAX_DATA8 | MAX_DATA7 | MAX_DATA6 | MAX_DATA5 | MAX_DATA4 | MAX_DATA3 | MAX_DATA2 |
|---|---|---|---|---|---|---|---|

BIT 31          BIT 24

BIT 0:5   – ZERO FILLED
BIT 7:15  – ACQUISITION MINIMUM DATA REGISTER.
BIT 16:21 – ZERO FILLED
BIT 22:31 – ACQUISITION MAXIMUM DATA REGISTER.

ACQUISITION SUM DATA REGISTER (READ REGISTER)
130

| AR_SUM7 | AR_SUM6 | AR_SUM5 | AR_SUM4 | AR_SUM3 | AR_SUM2 | AR_SUM1 | AR_SUM0 |
|---|---|---|---|---|---|---|---|

BIT 7          BIT 0

| AR_SUM15 | AR_SUM14 | AR_SUM13 | AR_SUM12 | AR_SUM11 | AR_SUM10 | AR_SUM9 | AR_SUM8 |
|---|---|---|---|---|---|---|---|

BIT 15          BIT 8

| AR_SUM23 | AR_SUM22 | AR_SUM21 | AR_SUM20 | AR_SUM19 | AR_SUM18 | AR_SUM17 | AR_SUM16 |
|---|---|---|---|---|---|---|---|

BIT 23          BIT 16

| AR_SUM31 | AR_SUM30 | AR_SUM29 | AR_SUM28 | AR_SUM27 | AR_SUM26 | AR_SUM25 | AR_SUM24 |
|---|---|---|---|---|---|---|---|

BIT 31          BIT 24

BIT 0:31 – ACQUISITION SUMMATION REGISTER.

Figure 7

STATUS REGISTER (READ REGISTER)
800

| HC_CH2 | HC_CH1 | EX_OC_CH2 | EX_OC_CH1 | OT_WRN_CH2 | OT_WRN_CH1 | OT_ERR_CH2 | OT_ERR_CH1 |
|---|---|---|---|---|---|---|---|

BIT 7 ... BIT 0

| CLP_CH2 | CLP_CH1 | HV_CH2 | HV_CH1 | EX_CLP_CH2 | EX_CLP_CH1 | OC_CH2 | OC_CH1 |
|---|---|---|---|---|---|---|---|

BIT 15 ... BIT 8

| | | | OV | UV | ACQ_DONE | /STBY_CH2 | /STBY_CH1 |
|---|---|---|---|---|---|---|---|

BIT 23 ... BIT 16

| | | | | | | | |
|---|---|---|---|---|---|---|---|

BIT 31 ... BIT 24

BIT 0:1   – OVER TEMPERATURE ERROR FOR CHX. MAXIMUM TEMPERATURE THRESHOLD HAS BEEN EXCEEDED BY CHX.
BIT 2:3   – OVER TEMPERATURE WARNING FOR CHX. XX% OF TEMPERATURE THRESHOLD HAS BEEN EXCEEDED BY CHX.
BIT 4:5   – EXCESS OVER CURRENT CHX.
BIT 6:7   – HIGH CURRENT CHX.
BIT 8:9   – OVER CURRENT CHX.
BIT 10:11 – EXCESS CLIP CHX.
BIT 12:13 – HIGH VOLTAGE CHX.
BIT 14:15 – CLIPPING CHX.
BIT 16:17 – STANDBY CHX. ACTIVE LOW.
BIT 18   – ACQUISITION REGISTER STATUS BUSY BIT. BUSY= 0, DONE= 1.
BIT 19   – UNDERVOLTAGE THRESHOLD EVENT OCCURRED.
BIT 20   – OVERVOLTAGE THRESHOLD EVENT OCCURRED.

Figure 8

INTERRUPT1 MASK REGISTER (WRITE REGISTER)
905

| HC_CH2 | HC_CH1 | EX_OC_CH2 | EX_OC_CH1 | OT_WRN_CH2 | OT_WRN_CH1 | OT_ERR_CH2 | OT_ERR_CH1 |
|---|---|---|---|---|---|---|---|

BIT 7 ... BIT 0

| CLP_CH2 | CLP_CH1 | HV_CH2 | HV_CH1 | EX_CLP_CH2 | EX_CLP_CH1 | OC_CH2 | OC_CH1 |
|---|---|---|---|---|---|---|---|

BIT 15 ... BIT 8

| | | | OV | UV | ACQ_DONE | /STBY_CH2 | /STBY_CH1 |
|---|---|---|---|---|---|---|---|

BIT 23 ... BIT 16

| INT1_TYPE | | | | | | | |
|---|---|---|---|---|---|---|---|

BIT 31 ... BIT 24

BIT 0:20 – STATUS BITS THAT MAP TO INT1, LAYOUT IS THE SAME AS BITS OF STATUS
BIT 21:30 – UNIMPLEMENTED.
BIT 31 – INTERRUPT1 TYPE LEVEL=0, EDGE=1 INTERRUPT SIGNAL IS TRUE WHEN PULLED LOW IN EITHER CASE. STATUS IS TRUE WHEN 1.

INTERRUPT2 MASK REGISTER (WRITE REGISTER)
910

| HC_CH2 | HC_CH1 | EX_OC_CH2 | EX_OC_CH1 | OT_WRN_CH2 | OT_WRN_CH1 | OT_ERR_CH2 | OT_ERR_CH1 |
|---|---|---|---|---|---|---|---|

BIT 7 ... BIT 0

| CLP_CH2 | CLP_CH1 | HV_CH2 | HV_CH1 | EX_CLP_CH2 | EX_CLP_CH1 | OC_CH2 | OC_CH1 |
|---|---|---|---|---|---|---|---|

BIT 15 ... BIT 8

| | | | OV | UV | ACQ_DONE | /STBY_CH2 | /STBY_CH1 |
|---|---|---|---|---|---|---|---|

BIT 23 ... BIT 16

| INT2_TYPE | | | | | | | |
|---|---|---|---|---|---|---|---|

BIT 31 ... BIT 24

BIT 0:20 – STATUS BITS THAT MAP TO INT2, LAYOUT IS THE SAME AS BITS OF STATUS
BIT 21:30 – UNIMPLEMENTED
BIT 31 – INTERRUPT2 TYPE LEVEL=0, EDGE=1 INTERRUPT SIGNAL IS TRUE WHEN PULLED LOW IN EITHER CASE. STATUS IS TRUE WHEN 1.

Figure 9

DEFAULT INTERRUPT1 MASK REGISTER
1005

| HC_CH2 | HC_CH1 | EX_OC_CH2 | EX_OC_CH1 | OT_WRN_CH2 | OT_WRN_CH1 | OT_ERR_CH2 | OT_ERR_CH1 |
|---|---|---|---|---|---|---|---|

BIT 7                  BIT 0

| CLP_CH2 | CLP_CH1 | HV_CH2 | HV_CH1 | EX_CLP_CH2 | EX_CLP_CH1 | OC_CH2 | OC_CH1 |
|---|---|---|---|---|---|---|---|

BIT 15                 BIT 8

|  |  |  | OV | UV | ACQ_DONE | /STBY_CH2 | /STBY_CH1 |
|---|---|---|---|---|---|---|---|

BIT 23                 BIT 16

| INT1_TYPE |  |  |  |  |  |  |  |
|---|---|---|---|---|---|---|---|

BIT 31                 BIT 24

BIT 0:20 – STATUS BITS THAT MAP TO INT1, LAYOUT IS THE SAME AS BITS OF STATUS
BIT 21:30 – UNIMPLEMENTED.
BIT 31   – INTERRUPT1 TYPE LEVEL=0, EDGE=1 INTERRUPT SIGNAL IS TRUE WHEN
            PULLED LOW IN EITHER CASE. STATUS IS TRUE WHEN 1.

DEFAULT INTERRUPT2 MASK REGISTER
1010

| HC_CH2 | HC_CH1 | EX_OC_CH2 | EX_OC_CH1 | OT_WRN_CH2 | OT_WRN_CH1 | OT_ERR_CH2 | OT_ERR_CH1 |
|---|---|---|---|---|---|---|---|

BIT 7                  BIT 0

| CLP_CH2 | CLP_CH1 | HV_CH2 | HV_CH1 | EX_CLP_CH2 | EX_CLP_CH1 | OC_CH2 | OC_CH1 |
|---|---|---|---|---|---|---|---|

BIT 15                 BIT 8

|  |  |  | OV | UV | ACQ_DONE | /STBY_CH2 | /STBY_CH1 |
|---|---|---|---|---|---|---|---|

BIT 23                 BIT 16

| INT2_TYPE |  |  |  |  |  |  |  |
|---|---|---|---|---|---|---|---|

BIT 31                 BIT 24

BIT 0:20 – STATUS BITS THAT MAP TO INT2, LAYOUT IS THE SAME AS BITS OF STATUS
BIT 21:30 – UNIMPLEMENTED
BIT 31   – INTERRUPT2 TYPE LEVEL=0, EDGE=1 INTERRUPT SIGNAL IS TRUE WHEN
            PULLED LOW IN EITHER CASE. STATUS IS TRUE WHEN 1.

Figure 10

OVERCURRENT CH1 (READ REGISTER)

| OC_CNT7 | OC_CNT6 | OC_CNT5 | OC_CNT4 | OC_CNT3 | OC_CNT2 | OC_CNT1 | OC_CNT0 |
|---|---|---|---|---|---|---|---|

BIT 7     BIT 0

| OC_CNT15 | OC_CNT14 | OC_CNT13 | OC_CNT12 | OC_CNT11 | OC_CNT10 | OC_CNT9 | OC_CNT8 |
|---|---|---|---|---|---|---|---|

BIT 15     BIT 8

| OC_CNT23 | OC_CNT22 | OC_CNT21 | OC_CNT20 | OC_CNT19 | OC_CNT18 | OC_CNT17 | OC_CNT16 |
|---|---|---|---|---|---|---|---|

BIT 23     BIT 16

| OC_CNT31 | OC_CNT30 | OC_CNT29 | OC_CNT28 | OC_CNT27 | OC_CNT26 | OC_CNT25 | OC_CNT24 |
|---|---|---|---|---|---|---|---|

BIT 31     BIT 24

BIT 0:31 – OVER CURRENT EVENT COUNT (LOGIC OR OF POSITIVE AND NEGATIVE OVERCURRENT)

POSITIVE OVERCURRENT CH1 (READ REGISTER)

| POS_CNT7 | POS_CNT6 | POS_CNT5 | POS_CNT4 | POS_CNT3 | POS_CNT2 | POS_CNT1 | POS_CNT0 |
|---|---|---|---|---|---|---|---|

BIT 7     BIT 0

| POS_CNT15 | POS_CNT14 | POS_CNT13 | POS_CNT12 | POS_CNT11 | POS_CNT10 | POS_CNT9 | POS_CNT8 |
|---|---|---|---|---|---|---|---|

BIT 15     BIT 8

| POS_CNT23 | POS_CNT22 | POS_CNT21 | POS_CNT20 | POS_CNT19 | POS_CNT18 | POS_CNT17 | POS_CNT16 |
|---|---|---|---|---|---|---|---|

BIT 23     BIT 16

| POS_CNT31 | POS_CNT30 | POS_CNT29 | POS_CNT28 | POS_CNT27 | POS_CNT26 | POS_CNT25 | POS_CNT24 |
|---|---|---|---|---|---|---|---|

BIT 31     BIT 24

BIT 0:31 – POSITIVE OVER CURRENT EVENT COUNT

Figure 13

NEGATIVE OVERCURRENT CH1 (READ REGISTER)

| NEG_CNT7 | NEG_CNT6 | NEG_CNT5 | NEG_CNT4 | NEG_CNT3 | NEG_CNT2 | NEG_CNT1 | NEG_CNT0 |
|---|---|---|---|---|---|---|---|

BIT 7 — BIT 0

| NEG_CNT15 | NEG_CNT14 | NEG_CNT13 | NEG_CNT12 | NEG_CNT11 | NEG_CNT10 | NEG_CNT9 | NEG_CNT8 |
|---|---|---|---|---|---|---|---|

BIT 15 — BIT 8

| NEG_CNT23 | NEG_CNT22 | NEG_CNT21 | NEG_CNT20 | NEG_CNT19 | NEG_CNT18 | NEG_CNT17 | NEG_CNT16 |
|---|---|---|---|---|---|---|---|

BIT 23 — BIT 16

| NEG_CNT31 | NEG_CNT30 | NEG_CNT29 | NEG_CNT28 | NEG_CNT27 | NEG_CNT26 | NEG_CNT25 | NEG_CNT24 |
|---|---|---|---|---|---|---|---|

BIT 31 — BIT 24

BIT 0:31 — NEGATIVE OVER CURRENT EVENT COUNT

IOC (CLIPPING/OVERLOAD) CH1 (READ REGISTER)

| OL_CNT7 | OL_CNT6 | OL_CNT5 | OL_CNT4 | OL_CNT3 | OL_CNT2 | OL_CNT1 | OL_CNT0 |
|---|---|---|---|---|---|---|---|

BIT 7 — BIT 0

| OL_CNT15 | OL_CNT14 | OL_CNT13 | OL_CNT12 | OL_CNT11 | OL_CNT10 | OL_CNT9 | OL_CNT8 |
|---|---|---|---|---|---|---|---|

BIT 15 — BIT 8

| OL_CNT23 | OL_CNT22 | OL_CNT21 | OL_CNT20 | OL_CNT19 | OL_CNT18 | OL_CNT17 | OL_CNT16 |
|---|---|---|---|---|---|---|---|

BIT 23 — BIT 16

| OL_CNT31 | OL_CNT30 | OL_CNT29 | OL_CNT28 | OL_CNT27 | OL_CNT26 | OL_CNT25 | OL_CNT24 |
|---|---|---|---|---|---|---|---|

BIT 31 — BIT 24

BIT 0:31 — OVERLOAD (CLIP) EVENT COUNT

Figure 14

OVERCURRENT CH2 (READ REGISTER)

| OC_CNT7 | OC_CNT6 | OC_CNT5 | OC_CNT4 | OC_CNT3 | OC_CNT2 | OC_CNT1 | OC_CNT0 |
|---|---|---|---|---|---|---|---|

BIT 7     BIT 0

| OC_CNT15 | OC_CNT14 | OC_CNT13 | OC_CNT12 | OC_CNT11 | OC_CNT10 | OC_CNT9 | OC_CNT8 |
|---|---|---|---|---|---|---|---|

BIT 15     BIT 8

| OC_CNT23 | OC_CNT22 | OC_CNT21 | OC_CNT20 | OC_CNT19 | OC_CNT18 | OC_CNT17 | OC_CNT16 |
|---|---|---|---|---|---|---|---|

BIT 23     BIT 16

| OC_CNT31 | OC_CNT30 | OC_CNT29 | OC_CNT28 | OC_CNT27 | OC_CNT26 | OC_CNT25 | OC_CNT24 |
|---|---|---|---|---|---|---|---|

BIT 31     BIT 24

BIT 0:31 – OVER CURRENT EVENT COUNT (LOGIC OR OF POSITIVE AND NEGATIVE OVERCURRENT)

POSITIVE OVERCURRENT CH2 (READ REGISTER)

| POS_CNT7 | POS_CNT6 | POS_CNT5 | POS_CNT4 | POS_CNT3 | POS_CNT2 | POS_CNT1 | POS_CNT0 |
|---|---|---|---|---|---|---|---|

BIT 7     BIT 0

| POS_CNT15 | POS_CNT14 | POS_CNT13 | POS_CNT12 | POS_CNT11 | POS_CNT10 | POS_CNT9 | POS_CNT8 |
|---|---|---|---|---|---|---|---|

BIT 15     BIT 8

| POS_CNT23 | POS_CNT22 | POS_CNT21 | POS_CNT20 | POS_CNT19 | POS_CNT18 | POS_CNT17 | POS_CNT16 |
|---|---|---|---|---|---|---|---|

BIT 23     BIT 16

| POS_CNT31 | POS_CNT30 | POS_CNT29 | POS_CNT28 | POS_CNT27 | POS_CNT26 | POS_CNT25 | POS_CNT24 |
|---|---|---|---|---|---|---|---|

BIT 31     BIT 24

BIT 0:31 – POSITIVE OVER CURRENT EVENT COUNT

Figure 15

NEGATIVE OVERCURRENT CH2 (READ REGISTER)

| NEG_CNT7 | NEG_CNT6 | NEG_CNT5 | NEG_CNT4 | NEG_CNT3 | NEG_CNT2 | NEG_CNT1 | NEG_CNT0 |
|---|---|---|---|---|---|---|---|

BIT 7 ... BIT 0

| NEG_CNT15 | NEG_CNT14 | NEG_CNT13 | NEG_CNT12 | NEG_CNT11 | NEG_CNT10 | NEG_CNT9 | NEG_CNT8 |
|---|---|---|---|---|---|---|---|

BIT 15 ... BIT 8

| NEG_CNT23 | NEG_CNT22 | NEG_CNT21 | NEG_CNT20 | NEG_CNT19 | NEG_CNT18 | NEG_CNT17 | NEG_CNT16 |
|---|---|---|---|---|---|---|---|

BIT 23 ... BIT 16

| NEG_CNT31 | NEG_CNT30 | NEG_CNT29 | NEG_CNT28 | NEG_CNT27 | NEG_CNT26 | NEG_CNT25 | NEG_CNT24 |
|---|---|---|---|---|---|---|---|

BIT 31 ... BIT 24

BIT 0:31 — NEGATIVE OVER CURRENT EVENT COUNT

IOC (CLIPPING/OVERLOAD) CH2 (READ REGISTER)

| OL_CNT7 | OL_CNT6 | OL_CNT5 | OL_CNT4 | OL_CNT3 | OL_CNT2 | OL_CNT1 | OL_CNT0 |
|---|---|---|---|---|---|---|---|

BIT 7 ... BIT 0

| OL_CNT15 | OL_CNT14 | OL_CNT13 | OL_CNT12 | OL_CNT11 | OL_CNT10 | OL_CNT9 | OL_CNT8 |
|---|---|---|---|---|---|---|---|

BIT 15 ... BIT 8

| OL_CNT23 | OL_CNT22 | OL_CNT21 | OL_CNT20 | OL_CNT19 | OL_CNT18 | OL_CNT17 | OL_CNT16 |
|---|---|---|---|---|---|---|---|

BIT 23 ... BIT 16

| OL_CNT31 | OL_CNT30 | OL_CNT29 | OL_CNT28 | OL_CNT27 | OL_CNT26 | OL_CNT25 | OL_CNT24 |
|---|---|---|---|---|---|---|---|

BIT 31 ... BIT 24

BIT 0:31 — OVERLOAD (CLIP) EVENT COUNT

Figure 16

DIAGNOSTIC SYSTEM FOR POWER CONVERTER

PRIORITY CLAIM

This application claims the benefit of priority from U.S. Provisional Patent Application No. 60/742,762, filed Dec. 6, 2005, which is incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Technical Field

The present invention relates to a diagnostic system for a power converter.

2. Related Art

Audio systems, such as those used in vehicles, may include a variety of system components. Such system components may include various audio sources, audio signal processors, channel power amplifiers, power supplies, and the like. In vehicle installations, as well as other installations, these components are subjected to a variety of conditions that may result in faulty operation of the audio system. Some defects may arise due to faulty installation and/or manufacture of the audio system. For example, non-connected and/or open transducers may occur at the time of manufacture. Other defects may result from longer term exposure to the ambient conditions in which the audio system operates thereby becoming evident only after the audio system has been in operation for a time. Faults resulting from short and open connections as well as defective transducers are not uncommon when the audio system is subject to long term thermal and vibrational stress. For example, channel power amplifiers (or other power converters) may have their outputs shorted to ground, to battery circuits, or to each other.

Shorts between significantly dissimilar potentials may result in large currents that can activate the protection circuitry of an amplifier. In such situations, any occurrence of an overcurrent event would most likely be the consequence of some form of short on the overloaded output. What is not evident from the overcurrent event signal is the specific nature of the fault. Additional information may be required in order to discern the nature of the fault. Therefore, a need exists to better diagnose the cause of overcurrents or other errors in an audio system.

SUMMARY OF THE INVENTION

A power converter system that includes a diagnostic system is presented. The power converter system may control and convert electrical power (such as voltage and current) from one form to another. One example of a power converter system is an audio amplifier system, such as a switch-mode amplifier. The diagnostic system in the power converter system may collect data indicative of signals in the power converter system and may analyze the data. For example, a data acquisition system in the diagnostic system may measure voltages or currents that are indicative (such as identical signals or attenuated signals) of inputs, outputs, or signals internal to the power converter system.

In the example of an amplifier system, the data acquisition system may measure the input(s) to the amplifier, the output (s) of the amplifier, the currents in the amplifier system (such as the currents that drive the half bridges of the amplifier), the voltages in the amplifier system (such as the voltages that drive various sections of the amplifier, the voltage of the battery), and sensed temperature in various parts of the amplifier system. The measured inputs may be taken and/or analyzed at predetermined times (such as a user-defined time). The measured inputs may also be taken and/or analyzed at a circuit-defined time.

For example, the diagnostic system may measure inputs over one cycle, or over multiple cycles, with the number of cycles determined by the user. In particular, the diagnostic system may be operated in a burst mode whereby multiple measurements are taken, once during each cycle in the burst mode. The diagnostic system may analyze the multiple measurements, including determining the maximum value, minimum value, and sum for one of the signals in the amplifier system over the multiple cycles in the burst mode. And, the analysis may be used to diagnose one or more potential problems in the amplifier system.

The diagnostic system may also measure or analyze signals in the power converter circuit based on a predefined operation of the power converter circuit, such as during an overcurrent, an overvoltage, a higher than expected current, and/or a higher than expected voltage in the power converter circuit. For example, during an overcurrent in the amplifier (detected by an overcurrent circuit), the diagnostic system may compare the output voltages of the amplifier with predefined voltages (such as determining whether the output voltage of the amplifier is identical to or within a window of the battery voltage or the ground voltage). The diagnostic system may count the number of times that the output voltage (or another signal in the amplifier) is the identical to or within a window of the predefined voltages. As another example, the diagnostic system may count a number of times of overcurrents or higher than expected currents (such as a number of positive overcurrents, negative overcurrents, and total overcurrents). As still another example, the diagnostic system may count a number of times when an overvoltage occurs or when a voltage is clipped, as detected by an overvoltage circuit. When the number of times reaches a predetermined number (that may be programmed), an interrupt may be sent to a processor. The processor may analyze the number of times, and other data acquired by the diagnostic system, to diagnose one or more potential problems in the power converter system.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 1 is a schematic block diagram of an amplifier system 100 that may be used in, for example, a vehicle or the like.

FIGS. 4 through 7 show exemplary manners in which to implement the acquisition control register shown in FIG. 3.

FIG. 8 illustrates one exemplary manner in which a status register for a power amplifier channel may be implemented.

FIG. 9 illustrates a pair of exemplary interrupt mask registers that are programmable by the processor shown in FIG. 1.

FIG. 10 illustrates a pair of default interrupt mask registers corresponding to the mask registers shown in FIG. 9.

FIGS. 13 through 16 illustrate exemplary implementations of registers that may be used to capture overcurrent and overload events for two power amplification channels.

FIG. 21 is a schematic block diagram of an exemplary overvoltage detection circuit that may be used in connection with the data acquisition system of FIG. 3.

DETAILED DESCRIPTION OF THE PREFERRED EMBODIMENTS

Figure 1:
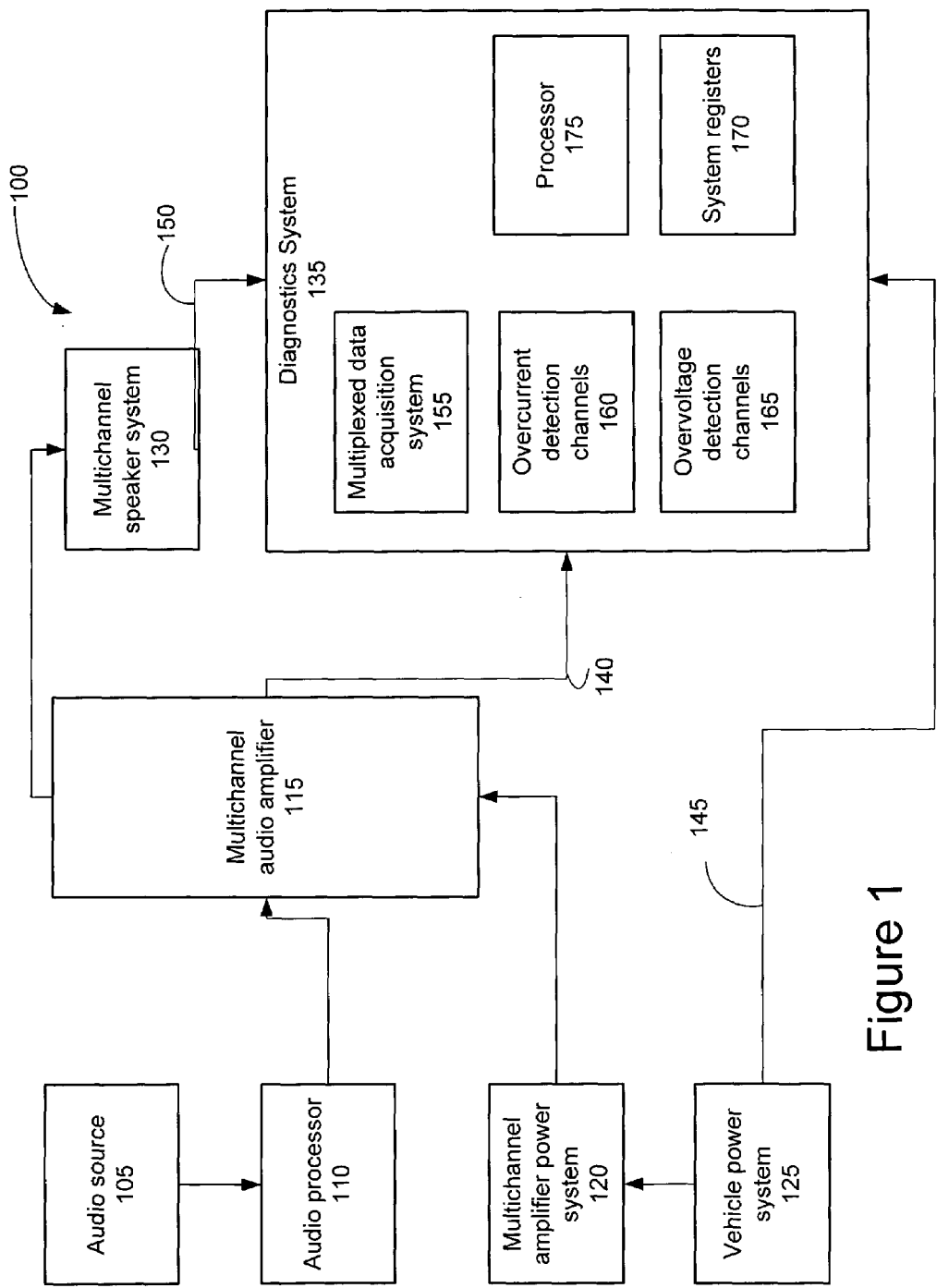

FIG. 1 is a schematic block diagram of an amplifier system 100 that may be used in, for example, a vehicle or the like. System 100 may be constructed as a single or multichannel system. In FIG. 1, system 100 is shown as a multichannel media system. To this end, system 100 includes a multichannel audio source 105 that provides multichannel audio to the input of an audio processor 110. The audio processor 110, in turn, provides audio signals for amplification to the input of a multichannel audio amplifier 115. The multichannel audio amplifier 115 receives power from an amplifier power system 120 that is connected to the power supply system 125 of the vehicle. A multichannel speaker system 130 is connected to receive the amplified audio output from the multichannel audio amplifier 115.

The audio amplifier is one example of a power converter. The power converter may control and convert electrical power (such as voltage and current) from one form to another. The following are four example classifications of power conversion: (1) rectification referring to conversion of ac voltage to dc voltage; (2) DC-to-AC conversion; (3) DC-to DC conversion; and (4) AC-to-AC conversion. These four classifications are provided solely for illustration of the applications of a power converter. There may be other classifications of power converters.

Amplifiers in the audio system may increase the voltage, current, or power of an input signal. One application of an amplifier is in audio equipment. There are several types of classes of amplifiers, such as classes A-D amplifiers. For example, a class D amplifier is a switch mode type of amplifier that may operate in the digital domain. It may employ a pair of transistors that are connected in push-pull and driven to act as a switch, and a series-tuned output filter, which may allow only the fundamental-frequency component of the resultant square wave to reach the load. Moreover, the class D amplifier may generate the equivalent analog output for the speakers in an audio system by using pulse width modulation (PWM) or pulse density modulation (PDM) rather than the traditional digital-to-analog conversion.

Moreover, it may be difficult to diagnose problems when an amplifier malfunctions. The malfunction may produce a constant error, or may produce an intermittent error (further complicating diagnosis). Class D amplifiers (as well as other some other power converters) may be particularly difficult to diagnose since they operate with a quiescent current. Therefore, it may be especially difficult to diagnose potential problems in a class D amplifier system since currents are normally found even without any output being generated.

To diagnose potential problems, system 100 includes a diagnostics system 135 that is adapted to detect and monitor various system signals. For example, various power and modulation signals may be received for analysis by the diagnostics system 135 from the multichannel audio amplifier 115 over one or more lines 140. Power signals from the vehicle power system 125 may be provided to the diagnostics system 135 over one or more lines 145. Signals corresponding to the operation of the multichannel speaker system 130 may be provided to the diagnostics system 135 over one or more lines 150.

Diagnostics system 135 may include a number of different subsystems adapted to detect and identify various system faults. To this end, diagnostics system 135 may include a multiplexed data acquisition system 155, one or more overcurrent detection channels 160, and one or more overvoltage detection channels 165. Data relating to faults detected by system 155 and channels 160 and 165 may be stored in one or more system registers 170. The information stored in the system registers 170 may be accessed by, for example, a processor 175. The processor 175 may use the stored information to identify the source of a fault and/or designate action that is to be taken as a result of a fault. For example, the inputs to the diagnostics system may include: the input(s) to the amplifier; the output(s) of the amplifier; the currents in the amplifier system (such as the currents that drive the half bridges of the amplifier); the voltages in the amplifier system (such as the voltages that drive various sections of the amplifier, the voltage of the battery); and sensed temperature in various parts of the amplifier system. Other, or different, inputs may be input to the diagnostic system.

Figure 2:
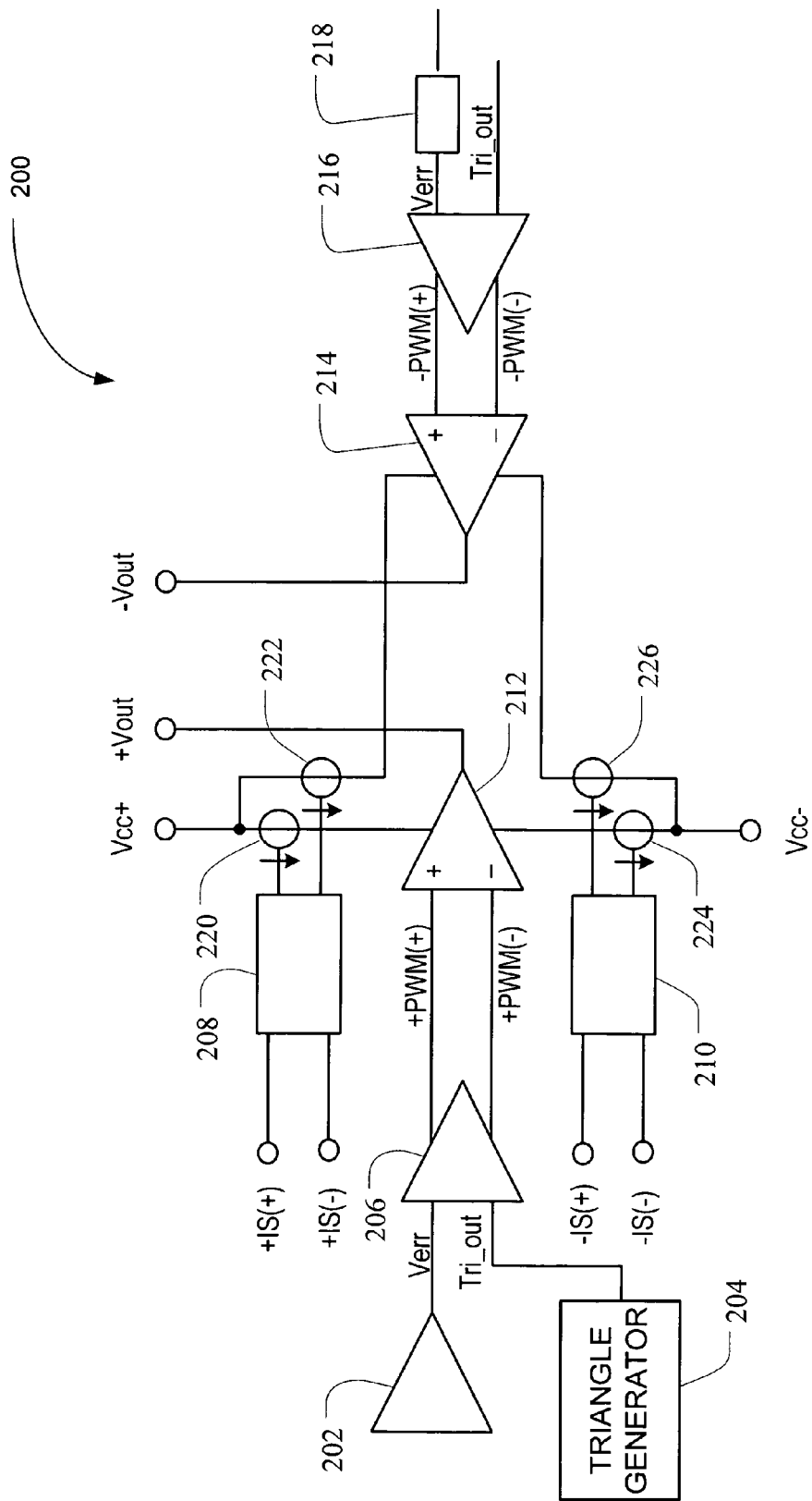
FIG. 2 is a schematic block diagram of an exemplary channel amplifier power stage that may be used in connection with the multichannel power amplifier shown in FIG. 1.

Multichannel audio amplifier 115 may be constructed in a variety of different manners. FIG. 2 is an example of a channel amplifier power stage 200 that may be used in connection with multichannel power amplifier 115. The power stage 200 may be constructed in an integrated circuit format and may be employ a full-bridge switch-mode power stage architecture. The switch-mode power stage 200 may maximize the available load voltage without increasing the peak signal to ground/chassis any more than necessary. EMI may also be reduced by using lower switching potentials as compared to a half-bridge power stage of the same output capabilities. In other examples, however, a half bridge, multiple half and/or full bridges, or any other form of switch mode power stage may be used.

FIG. 2 includes an error amplifier 202 with an output Verr, and an independent triangle (ramp) generator 204 with an output Tri_out. The error amplifier 202 may work in conjunction with a dynamic clamp circuit (not shown), which clamps the error amplifier 202 when the output stage clips. Verr and Tri_out may be sent directly to comparator 206 which produces differential outputs +PWM(+) and +PWM(−) driving half-bridge 212. Or, Verr and Tri_out may be sent via intermediate circuitry 218, which may include a −1 gain buffer to comparator 218, which produces differential outputs −PWM(+) and −PWM(−) driving half-bridge 214.

Any of the currents or voltages in power stage 200 may be sensed for diagnostic purposes. The current consumption of the power stage 200 may be sensed and, thus, the power being output by the power stage is correlated to the signals. Specifically, one or both of the differential analog current signals to half-bridges 212, 214 may be sensed. For example, current sensors 220, 224 may sense the differential analog signals for half-bridge 212, and current sensors 222, 226 may sense the differential analog signals for half-bridge 214. One or both of current sensors 220, 222 may be used to generate differential signals +IS(+), +IS(−). Circuitry 208 may output the greater of the two signals from current sensors 220, 222, or may output the sum of the two signals from current sensors 220, 222. Differential signals +IS(+), +IS(−) may be used for better noise immunity. Similarly, one or both of current sensors 224, 226 may be used to generate differential signals −IS(+), −IS(−). Circuitry 210 may output the greater of the two signals from current sensors 224, 226, or may output the sum of the two signals from current sensors 224, 226.

Further, the PWM signal or signals are available for measurement. For example, one or both of the inputs +PWM(+), +PWM(−) to half bridge 212 may be sensed, as well as one or both of the inputs −PWM(+), −PWM(−) to half bridge 214. Verr, the output of error amplifier 202 may be sensed and Tri_out, the output of triangle generator 204 may be sensed. The power supply rail voltages are also available for measurement. The amplified audio channel output is on the +Vout and −Vout terminals. The power stage is powered from +Vcc and −Vcc.

Figure 3:
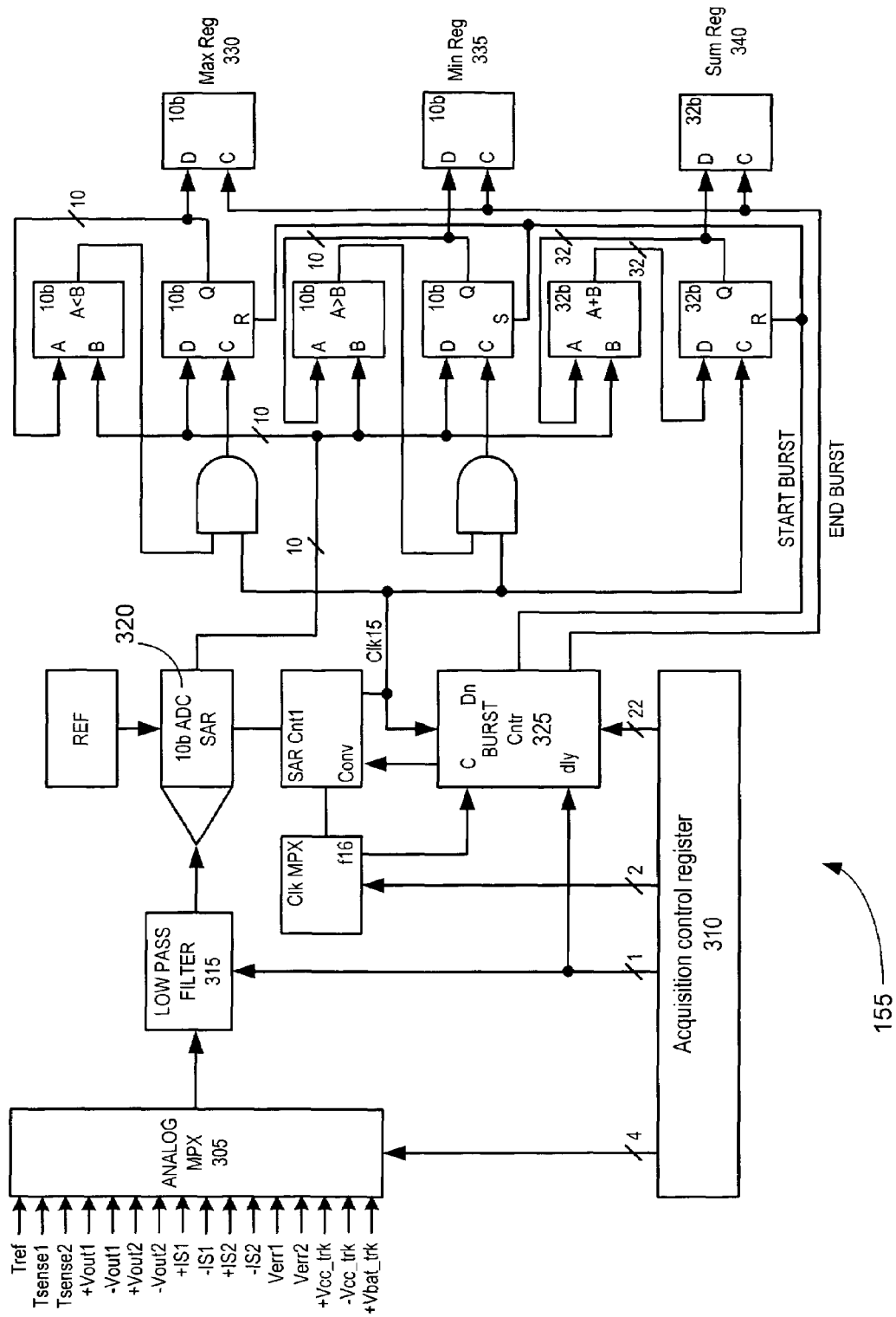
FIG. 3 is a schematic block diagram of an exemplary multiplexed data acquisition system that can be used as part of the diagnostics system shown in FIG. 1.

FIG. 3 is a schematic block diagram of an exemplary multiplexed data acquisition system 155 that can be used as part of the diagnostics system 135 to identify and isolate faults in the amplification system 100. FIGS. 4 and 5 illustrate alternative manners of implementing the write functionality of the acquisition control register 310 shown in FIG. 3, while FIG. 6 illustrates one manner of implementing the read functionality of the various data acquisition system registers 170 of the diagnostics system 135. In other examples, the configuration of the diagnostics system 135 and/or the registers 170 may be different depending on system design/performance criterion. The data acquisition system 155 may be implemented as a CMOS mixed signal integrated circuit. Considerable functionality is possible in CMOS mixed signal ASICs.

The multiplexed data acquisition system 155 may be employed to digitize scaled versions of various system signals that are to be checked. One or more of the various system signals may be attenuated prior to input to an analog multiplexer 305. These signals are provided to the input of the analog multiplexer 305 that is controlled by several output bits of an acquisition control register 310. For example, the output voltage of each power amplifier 200 may be monitored using attenuated signals corresponding to signals provided to the speaker leads, +Voutx and −Voutx, where x is the channel number. As shown in FIG. 3, the multiplexer includes input signals for two channels (see +Vout1, −Vout1, +Vout2, −Vout2). Further, FIG. 3 illustrates analog multiplexer 305. However, with additional circuitry, analog multiplexer 305 need not be included.

A scaled or attenuated version of the output stage power supply current may be input to +ISx and −ISx, (such as +IS1 for channel 1) where the currents being monitored are those powering the full bridge output stage. The +ISx and −ISx signals may be derived as single ended versions of the differential +ISx(+) and +ISx(−), and −ISx(+) and −ISx(−), respectively, from the power stage 200 shown in FIG. 2.

The analog multiplexer 305 may also input various other signals. For example, various temperature measurements of the audio amplifier 115 may be input including Tref, which may set a reference for the temperature sensors, Tsensex, which may be used to sense overtemperature using an NTC thermistor. As another example, voltages from the error amplifier 202, include Verr, may be input to the analog multiplexer 305. As still another example, +Vcc_trk and −Vcc_trk, representing voltages proportion to the positive and negative supply voltages, respectively, may be input to the analog multiplexer 305. Finally, Vbat_trk represents a voltage proportional to the battery voltages (such as the voltage from the battery on the vehicle).

The power supply currents of a switch-mode power channel amplifier may contain AC switching signals that correspond to the ripple currents that drive the output demodulation filter. These currents are non-trivial and can comprise 10% or more of the peak current that is allowed at maximum in the stage. Buck-derived output topologies such as class-D half-bridges and full-bridges also have discontinuous power supply current waveforms, making the spectrum of the supply currents very broad. If the unfiltered current waveforms were digitized by the analog-to-digital converter without some form of lowpass filtering, the resulting data output values could span the dynamic range of the fast switching currents of the power supplies. Therefore, a low-pass filter 315 may be included at the output of the multiplexer 305 to allow filtering of these inputs. The filter may be designed to pass audio frequencies, but to attenuate switching frequencies.

The data acquisition system 155 may include sample and hold functionality in an analog-to-digital converter 320. Analog-to-digital converter 320 may be constructed as a 10 bit capacitor ladder successive approximation analog to digital converter. Such a 10 bit digital converter has 1024 states or 3 digits of full-scale referenced resolution.

The data acquisition system 155 may perform an analysis, including a statistical analysis based on the one or more signals input to analog multiplexer 305. The statistical analysis, discussed in more detail below, may be used to diagnose potential problems in the audio amplifier 115. Further, the statistical analysis may be performed over a period of one or more cycles or conversions. In this manner, the data acquisition system 155 may perform the statistical analysis of a large number of data conversions without external processor intervention.

The number of cycles over which to perform the statistical analysis may be variable. For example, burst counter 325 may determine the number of cycles over which to perform the statistical analysis. The burst counter 325 may have a counter length of 22 bits that facilitates automatic execution of between 1 and 4,194,303 conversions. During the time that these conversions are made, an analysis of the one or more inputs to the analog multiplexer 305 may be performed. The analysis may be reflected in one or more output registers, which may be used to record the state of one of the signal that is being monitored (such as one of the inputs to the analog multiplexer 305). As shown in FIG. 3, the analysis may include a maximum register 330, which may record the maximum value reached for one of the inputs during the burst cycle. Or, the analysis may include a minimum register 335, which may record the minimum value reached by the monitored signal during the burst cycle. Further, the analysis may include an integrated sum of the monitored signal during the burst to cycle, provided at sum register 340. This integrated sum value may be used by the processor 175 to determine the average value for the monitored signal over the burst cycle period. The output of the registers 330, 335, and 340 may be stored in various status registers, examples of which are included in FIG. 7. FIG. 3 illustrates some examples of the analysis on the input signals that may be performed. Other analysis, such as the analysis discussed in FIGS. 16 and 21, may be performed in addition to (or instead of) the maximum value, minimum value, and sum during a burst period.

To initiate data conversion, data acquisition register 310 may be written with a non-zero burst count. The input and filter mode may be selected in the same register write operation. The burst count value may be selected to allow a measurement having a burst duration that coincides with the periodicity or record length of some predetermined signal that is being measured, such as a signal that is synthesized by a digital signal processor (DSP) or the like. Or, the burst duration may be determined based on the time analog-to-digital converter 320 takes to covert a signal. Thus, the clock cycle of analog-to-digital converter 320 may be the same as the burst duration. The average value of the signal may have its greatest significance when periodic signals are used and the measuring experiments are designed for the burst to extend over an integer number of signal repetitions.

In FIG. 6, one or more registers may record the largest number, such as a 10 bit number, that has been seen since the burst measurement began (max), and another (min) records the smallest. These registers are configured to receive the values provided from registers 330 and 335 shown in FIG. 3. At the start of the burst conversion, the max register 330 and its corresponding counterpart in register 170 may be set to the smallest value in the number system (in this case zero) and the minimum register 335 and its corresponding counterpart in register 170 may be set to the largest value in the number system. The resulting max and min of a signal may frequently be a useful statistic and may be gathered automatically in system 155 by digitally comparing each conversion output with the previously held value. The registers 330 and 335, as well as their corresponding counterparts in register 170, may be updated when a new maximum or minimum is encountered during the burst cycle.

In FIG. 6, the third register (sum) receives its value from registers 340 and corresponds to the accumulated sum of the data that has been digitized since the burst measurement began. If this 32 bit register is read by an external processor that initiated the burst conversion and the 32 bit number is divided by the burst count, the resulting statistic is the average value of the signal being digitized. Since division is an iterative operation, the division may be done by processor 175 rather than adding further hardware to the data acquisition system 155.

In one example, the sum register is read after executing a take a burst of 64 conversions. The value in the sum register at that point is a 16 bit value that corresponds to a 16 bit data conversion. The noise reducing effects of averaging may be evident in the result with a 4× signal-to-noise (S/N) improvement (sqrt(N)). The S/N improvement will occur if the signal being digitized is time varying and/or the measurement contains a least significant bit (LSB) of noise by nature.

The data acquisition system is very flexible in that traditional single-valued data conversion may still be done if the burst count is set to one. The cost in silicon to implement the added functionality of max, min and sum is very low since modern CMOS processes have small feature size devices used for digital logic.

The exemplary input data multiplexer shown in FIG. 3 accommodates two power amplification channels that share a single data converter 320. As discussed above, in addition to supply currents and output voltages being available for digitization, the output of the main feedback loop error amplifiers (Verr) and channel temperature sensor outputs (Tsense) are provided to the input of multiplexer 305. The temperature inputs are augmented with an external temperature reference (Tref) that has a voltage level corresponding to the level at which the temperature sensor inputs would be considered to be at their high temperature limit. An autonomous internal system of comparators may use these signals to direct amplifier thermal shutdowns and/or provide warnings and overtemperature status/interrupt signals to the external processor.

Power-Up Diagnostics

The system 135 may run an off-line diagnostic upon power-up. A more focused form of testing may be appropriate should a fault be sensed during on-line operation, and a processor interrupt created from the fault. One purpose of the power-up diagnostic may be to discover non-intermittent failures such as short-circuit and open-circuit conditions and to test the functionality of the amplifier system 100 including its power supply.

In one example, there are N channel pairs of PWM amplifiers (2*N channels or 2*N−1 when MaxCh is odd) each pair having an I²C port with a corresponding status register. One manner of implementing the status register is shown at of FIG. 8. As shown, each channel may have a status bit for overtemperature, temperature warning, overcurrent, high current, clipping, high output voltage, excess overcurrent events and excess clipping events. Excess events may be derived from counting events and/or when a predetermined count is exceeded, a status bit may be set. Clearing the associated counter could be required to clear the status bit. The act of reading the counter may clear the counter. Single event status bits may be cleared by reading the status register unless the condition persists, such as in the case of a thermal condition.

FIG. 9 illustrates a pair of exemplary interrupt mask registers 905 and 910 that are programmable by processor 175 while FIG. 10 illustrates a pair of corresponding default interrupt mask registers 1005 and 1010. The programmable registers 905 and 910 of FIG. 9 facilitate program control of the types of events that are to be serviced on a channel-by-channel basis. If need be, the interrupt masks 1005 and 1010 may be redefined dynamically. For example, factory testing of the system 100 might be directed to all of the possible causes for an interrupt, whereas testing during normal use might be directed to overtemperature, temperature warning, excess overcurrent events and excess clipping events. If no programmed events are designated, the default register of FIG. 10 may be used.

An example routine that describes a power-up test sequence as could first be done at the factory and perhaps done every time the vehicle is started is included as Appendix A. The thoroughness of the routine is optional in that it can be simplified by doing only certain portions. For example, testing during normal operation may be limited to the initial portions and not loudspeaker testing, which could be reserved for factory and service center testing.

Pursuant to the test shown in Appendix A, the vehicle battery voltage can be measured by using the Vbat_trk input to the multiplexer 305. If this voltage is too high, it may not be safe to enable the power supply 120. If the battery voltage is too low, further discharge of the battery by the amplifier system 100 may be undesirable and enablement of the power supply 120 may be inhibited. If the battery voltage is within tolerance, the power supply 120 may be enabled and further diagnostic tests may be continued.

Testing of the initial temperatures Tsense1 and Tsense2 and the temperature reference Tref may then be executed. If they are found to be within a predetermined range, the power up sequence may be continued. A faulty temperature reference Tref may imply a dysfunctional temperature protection system, which is a serious defect. In such instances, the power-up sequence could be aborted.

The +/−Vcc_trk signals may be used internally in the IC to control the amplitude of PWM modulators. By also making them available to the data acquisition system 155, it is possible to monitor the power supply voltages used by the output stages of the channel amplifiers to determine if they are within tolerances. This is a basic diagnostic for the power supply which is often regulated and has specific voltage expectations. This test of two measurements could be done before any amplifier channel is enabled. Should the power supply 120 be out of tolerance, further diagnostic testing could end by disabling the power supply 120.

Some power supplies allow energy saving modes of operation wherein the power supply voltages can be programmed. All voltage modes could be exercised and compared to acceptable tolerances if a more thorough power supply diagnostic were desired.

The next set of observations can be made with all amplifier channels disabled and the +/−Vout signals of all channels being measured. If there were twelve channels, then 24 measurements could be made. When the computer interface to the system supports the simultaneous addressing of multiple measuring ICs, they could be gang programmed to make the measurements. An example of such a bus capability appears in the general call address of the I²C bus. In the case of two channeled data acquisition systems being used to test a 12 channel amplifier, then all Vout signals may be measured using only four measurement commands each followed by six fast register reads of the sum registers.

A channel could require that there be a wait after disabling and before measurement to allow the output filters of the channels to charge their output filters to the rest state. If the output were shorted, that would occur very rapidly. Alternatively, a five time constant wait could be about 75 mS.

If there were a hard fault between the battery and an amplifier output, the same amplifier output could tend to measure similarly to the battery. Channels that are seen to be faulted to battery should not be subsequently enabled. Hard faults to ground could appear at amplifier +/−Vout signals as ground would measure. Since the attenuators for all Vout signals are referenced to a midpoint voltage Vr that may be sourced within the IC, that is the voltage expected when a channel is disabled, not ground. Outputs normally may float up to Vr when not enabled. Outputs may operate near ground when enabled and no input signal is present and may not, at such occasions, be distinguishable from a short. Channels with a fault to ground may be enabled for the purpose of doing a more extensive service diagnostic that would benefit from knowing the fault resistance.

Internal faults in an amplifier channel amplifier may tend to produce Vout signals that are equivalent to the +/−Vcc_trk signals. This is due to the fact that the most common internal amplifier failures involve faults to a power supply. Under these conditions the channel should not be enabled. It may be possible to continue the testing of and operation of all other channels that were not found faulted. Further testing of faulted channels may have diagnostic purpose depending on the nature of the fault. Faults to Vcc would not necessarily be such an occasion.

Once the basic integrity of the system has been observed with the amplifier channels 115 disabled, it is possible to advance to testing with the amplifier channels 115 enabled one by one. Comparing Verr signals to +/−Vout signals is one manner of testing the basic DC functionality of a channel. If any of the three signals has an unexpected DC offset, the channel may be defective. The average value of the supply currents could have a tolerance which could be observed at this time.

If only one channel is enabled at a time it is possible to test for hard faults between channels. The Vout signals of the enabled channel could be expected to go to ground while all others could remain at Vr. Any Vout line of a disabled amplifier that goes to ground may be identified as having a hard short to one of the two now driven Vout signals. Channels that are seen to be faulted together should not be subsequently enabled except for the cause of doing a service diagnostic that would benefit from an analysis of the cross-connecting resistance. In practice, faults between channels are most likely when they share segments of a wiring harness or are adjacent in a connector. Gang programming during channel-to-channel fault tests would be possible if associated pairs were enabled in separate groups.

Once the channels are observed to be properly functioning with no faults to any external or internal circuits speaker tests may be performed. Speaker shorts and opens may be tested with the introduction of input signals (from a DSP) to fully enabled amplifier channels. With a two channel data acquisition system (as shown in FIG. 3), only two test periods would be needed for a 12 channel amplifier as groups of six could be done in unison assuming the amplifier power supply permits the demand. Channels having multi-way crossovers could need to be given as many tests as there are transducer frequency bands.

Each speaker has an expected range of impedance for any given frequency of stimulus and thus has an expected current draw from the power stage for any given stimulus. The low pass filtered supply currents may be measured to minimize the inclusion of switching frequency content. Multi-way channels that have passive crossovers may be tested by using signals that are in-band for each loudspeaker, and be as much out-of-band as possible for the other speakers.

The multi-way case is the testing of tweeters where the test can be done with, for example, 21 KHz bursts. A burst of a few cycles, for example <500 uS, may be all that is needed for each test group. Even when the tweeter is open, the mid-range can draw some current, but less than would be expected if the tweeter were present. The ability to resolve the tweeter's current within the total channel current is important to this test. Use of a 10 bit conversion of the +/−IS signals could suffice. The maximum register 330 could be all that is needed in the observation using a simple high/low pass/fail criterion. If the current is too high, there may be a fault somewhere in the system, either lead-to-lead or within the transducer. If the current is too low, the transducer may be open or defective.

Transducers that are directly connected can be tested with a low-frequency stimulus that is below audibility or far below acoustic transduction limits for the transducer. A signal such as a synchronization pulse may be used to minimize unintended bandwidth and excess power while still allowing a large peak signal thereby providing a good S/N ratio with respect to the current information.

A subsonic pulse that could last for a predetermined time, such as only 200 mS, may be used to facilitate testing of the 12 channel example. In this manner, the low-frequency response may be tested in <300 mS using the gang programming of six two-channel ICs included in the system 100. One reason testing may be accomplished in less than twice the stimulus test time is that it is not necessary to wait for the full extent of one test group to finish before the next group is started. This is because the peak current draw would be expected at ~100 mS into each test and the two tests could overlap with data acquisition finishing at approximately 110 mS into each signal. More extensive diagnostics can be done for a number of cases that have been identified as defects in off-line diagnostics.

Real-Time Fault Diagnostics

It may be desirable for an audio amplifier such as used in a vehicle to be able to perform fault diagnostics in real-time with a minimum of special tests and diagnostic software usage. No signals other than those of normal usage, music and speech, may be used as the test stimuli. Complicating the matter is that the faults that are common are often intermittent in nature due to the high vibration present in the vehicle environment. Faults that are non-intermittent are usually much simpler to diagnose.

Insulating materials are at risk in vehicle environments due to extremes of temperature, chemical assaults and abrasion driven by shock and vibration. The output leads of a multi-channel audio amplifier are at risk of four primary types of fault:

1. Short to ground/chassis
2. Short to battery potential
3. Short across the speaker leads
4. Short to another channel's speaker leads Short to ground is the most likely due to the prevalence of the vehicles chassis. Sharp edges on sheet metal and pinches are a frequent cause of insulation failure which is also aggravated by vibration. Shorts to battery can occur within the wiring harness when wire to wire insulation fails or connectors become damaged. Not all battery circuits are continuously powered, i.e. turn signals, door locks, window motors, etc. Shorts across the speaker leads can happen anywhere along their path but within the loudspeaker is a very likely location due to proximity and possible high temperature operation of voice coils. The short to another channel's speaker leads is the least likely fault and is most likely to happen in or near the amplifier. As the wiring harness fans out from the amplifier such encounters are less likely.

Each fault may be constructed of multiple impedances in series which can become the effective load to an amplifier channel. Every one of the primary types includes the speaker lead impedance, a fault-point connection and a return path impedance. The fault-point connection portion of the total impedance may be very erratic and less than ideal as a short. Contact areas may be small and arcs may be initiated within the contact area. When arcs occur, the connecting plasma may become unstable and the vapor pressure of ionized metal may attempt to extinguish (blow out) the connection. The high temperature of the plasma may alter the surface texture of the adjacent metal, which then alters the electric field structure that triggers temporarily disconnecting plasmas to rejoin. Any energy lost to the resistance of the plasma may act to heat it further. Inductance in the surrounding circuit can enable transients of voltage that can re-fire the circuit making disconnection less likely. An arc is a random process even when it is sourced by a highly resonant structure.

The impedance of a speaker lead is the best understood part of the circuit but may not be a low inductance resistance. The self inductance of the speaker lead is an active part of the circuit.

The return impedance may vary greatly with the type of fault incurred. Faults to chassis are most likely to have a low impedance return path. Faults to another lead in a harness may be of similar character to the speaker lead portion. Battery circuits may contain unusual transient loads and even signal sources.

In many instances, power channel amplifiers can be powered from voltages greater than the battery potential of the vehicle power supply. Such amplifiers also may not employ ground as one of the output stage supply potentials, instead using a negative supply (−Vcc) similar in voltage magnitude to the positive supply (+Vcc).

When a power channel amplifier is a source with potentials greater than either ground or battery potential, fault currents may flow in both directions from the power channel amplifier. Therefore, the impedances within the fault circuit can give rise to both steady-state and transient potentials that, on the power channel amplifier end, differ significantly from ground or battery in either polarity or difference.

Significant faults may result in currents large enough that protective circuitry within the amplifier will be forced to operate to prevent amplifier destruction. One means available to the amplifier to understand the nature of the fault that it senses is to examine the output voltage at the time of overload. If the voltage of the amplifier outputs are examined at the moments of current overload for any given channel, there can be increased probability that the amplifier potential is within a range of voltage above or below the potential of ground or battery. The bimodal distribution of overload voltages could peak near (+/−Ipk*E[Rckt]) about ground or battery where Ipk is the limiting value of amplifier current and E[Rckt] is the statistically expected value of the fault circuit resistance. The L*dI/dt portion of the signal may spread the distribution of the fault voltage as the erratic nature of any arc results in a lively random dI/dt term.

When using a switch-mode amplifier, the demodulation filter is resonant and may introduce large transients of voltage when intermittent shorts are encountered. The transients may resonate at the dominant mode frequency of the filter. Voltages of 3 times the magnitude of Vcc are sometimes seen during intermittent faults. The dynamic nature of the voltage at the time of the current overload may prevent a highly accurate determination of the type of a fault based upon a single observation. Accurate fault detection may, however, be performed statistically.

When using a compact set of tests and measuring hardware, one method is to capture the statistics of the events, such as counting the number of overload events that occur when the output voltage of the suspect output is within a window of potential that spans the aforementioned bimodal distribution of voltages about ground and battery potential.

One method may include using gated window detectors that observe the output voltages and comparing them to a window of voltages that represent ground or battery. These window detectors may be gated by current overload events from the same channel of either polarity of supply. The output of the window detectors may be counted using a counter that increments with each event. Sixteen bits or more of a roll-over-inhibited binary counter can be used. The fact that such comparators are not active until an overload is already sensed, minimizes any risk that these detectors will create noise that disturbs proper signal processing, or creates EMI.

A full-bridge channel such as the one shown in FIG. 2 may have four gated window detectors, two on each output signal voltage. Of these two, one could be making comparison to a range of voltages about ground and the other to a range of voltages about battery potential. A two channel IC supporting such a paradigm may contain eight window detectors each with its own counter. Each channel may also include counters that count current overloads in each Vcc.

To diagnose a fault, processor 175 may first observe the overcurrent status of the status register 800 for the channel. Once the processor 175 determines that an overload is reported in a channel(s), a command may be given by the processor 175 to freeze the counting activity in all related counters for the channel(s) under investigation. All counters may be read before clearing the freeze bit. If the counts are not significant/too small, the diagnosis may be deferred until more counts have been gathered.

If more than one channel is reporting overloads, one explanation is that they are intermittently shorted together. Since any voltage is possible in this scenario it is not too useful to note what the counts from battery and ground counters were. (fault type 4) If the number of counts in an output windowing ground significantly exceeds the number of counts windowing battery, then output may be being shorted to ground (or vice versa) (fault types 1 or 2). If the number of overloads is large and neither windowing detector has an appropriate bias, then a shorted speaker may be likely (fault type 3).

To accommodate the range of impedances found in a variety of vehicle models, it may be necessary to adjust the window dimensions on a per channel basis for both battery and ground. The wiring resistances and return impedances may be different for each channel. The addition of accessories on battery circuits could also bias the proper window to lower voltages for maximized detection of faults to the battery. Since it is unlikely that the two outputs of a given channel are different in a given vehicle model, both output voltages could test by using the same windows. Alternatively, the windows could be specific for each output signal of a full-bridge output stage.

Some improvement in information may be possible if the windows are split into positive and negative halves with positive current overloads enabling window detectors using positive window halves, and negative current overloads having their own window detectors utilizing the negative window halves. One reason that this doubling of hardware may give some improvement in accuracy stems from the positive real nature of the impedances. Doubling the quantity of window detectors again to include positive overcurrents enabling the window detectors from negative window halves and vice versa may be used to improve diagnosis of channel-to-channel shorts. It is unlikely that any such improvement is advantageous as channel-to-channel shorts tend to be obvious from the fact that two channels are both encountering overload.

Figure 11:
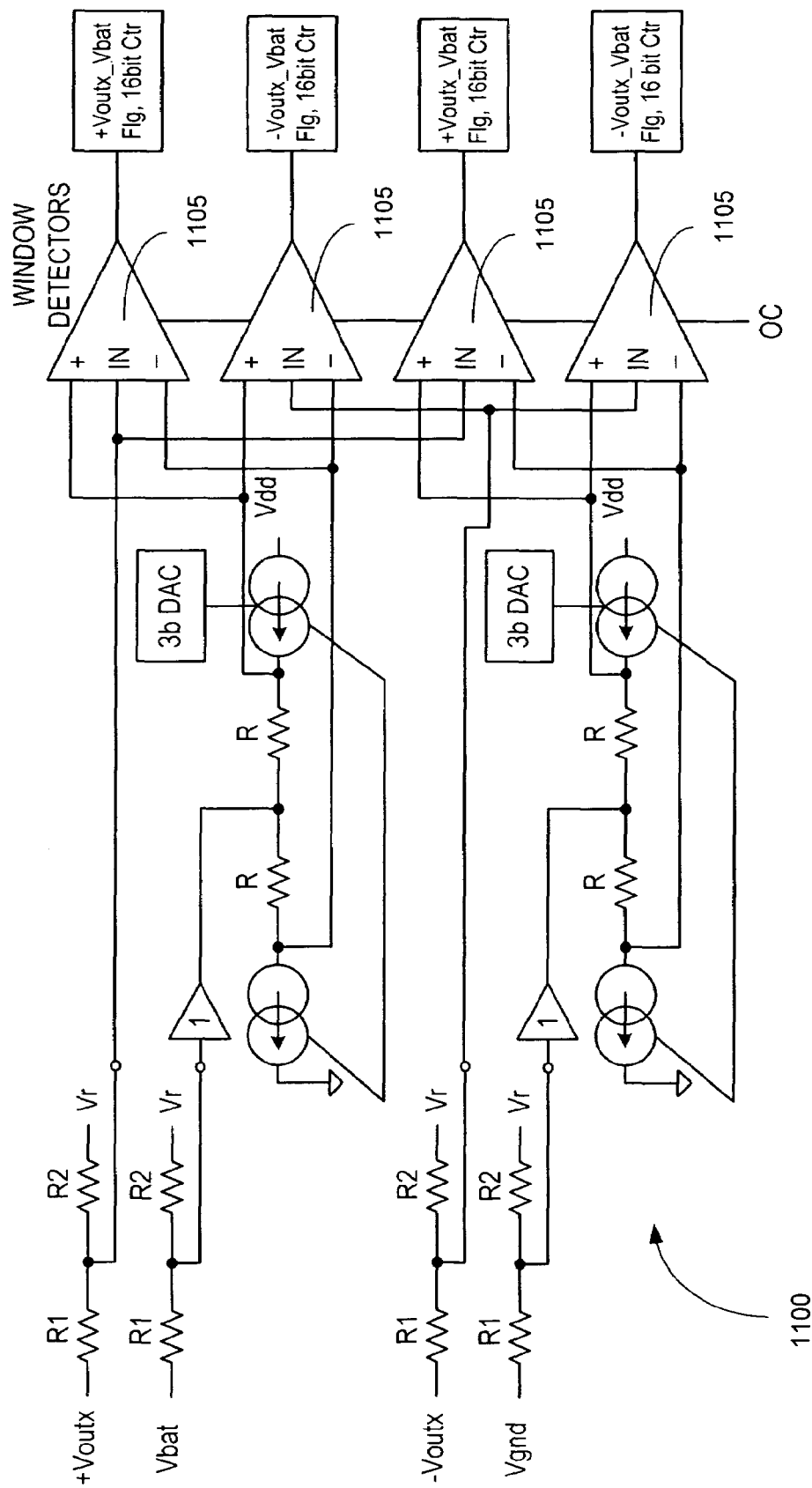
FIG. 11 is a schematic diagram of an exemplary statistical fault sensor circuit for use with the data acquisition system of FIG. 3 to monitor the full bridge power stage circuit of FIG. 2.

FIG. 11 is a schematic diagram of one example of a statistical fault sensor circuit 1100 that may be used for a windowing system that may be used in connection with a single detection channel. As shown, circuit 1100 employs a plurality of gated window detectors 1105. Ground potential can be measured as the equivalent voltage is not synonymous with actual ground voltage. Since the external attenuator formed from resistors R1 and R2 is design specific, the Vgnd attenuator may not be internal to the IC.

As shown in FIG. 11, the window detectors 1105 may be triggered by an overcurrent signal (OC). The overcurrent signal (OC) may be generated as shown in FIG. 16. In this manner, at the time an overcurrent occurs, various signals may be analyzed, such as counting the number of times certain events occur. For example, the 16 bit counters for +Voutx_Vbat or −Voutx_Vbat may count the number of times that one of the output voltages +Voutx and −Voutx is the same as Vbat. Similarly, the 16 bit counters for +Voutx_Vgnd or −Voutx_Vgnd may count the number of times that one of the output voltages +Voutx and −Voutx is the same as Vgnd. This may be used to analyze whether one of the output channels is shorted to Vbat or Vgnd. Similarly, other voltages may be compared to Vbat or Vgnd (or other voltages) and may be subject to similar counts when an overcurrent (OC) occurs.

Figure 12:
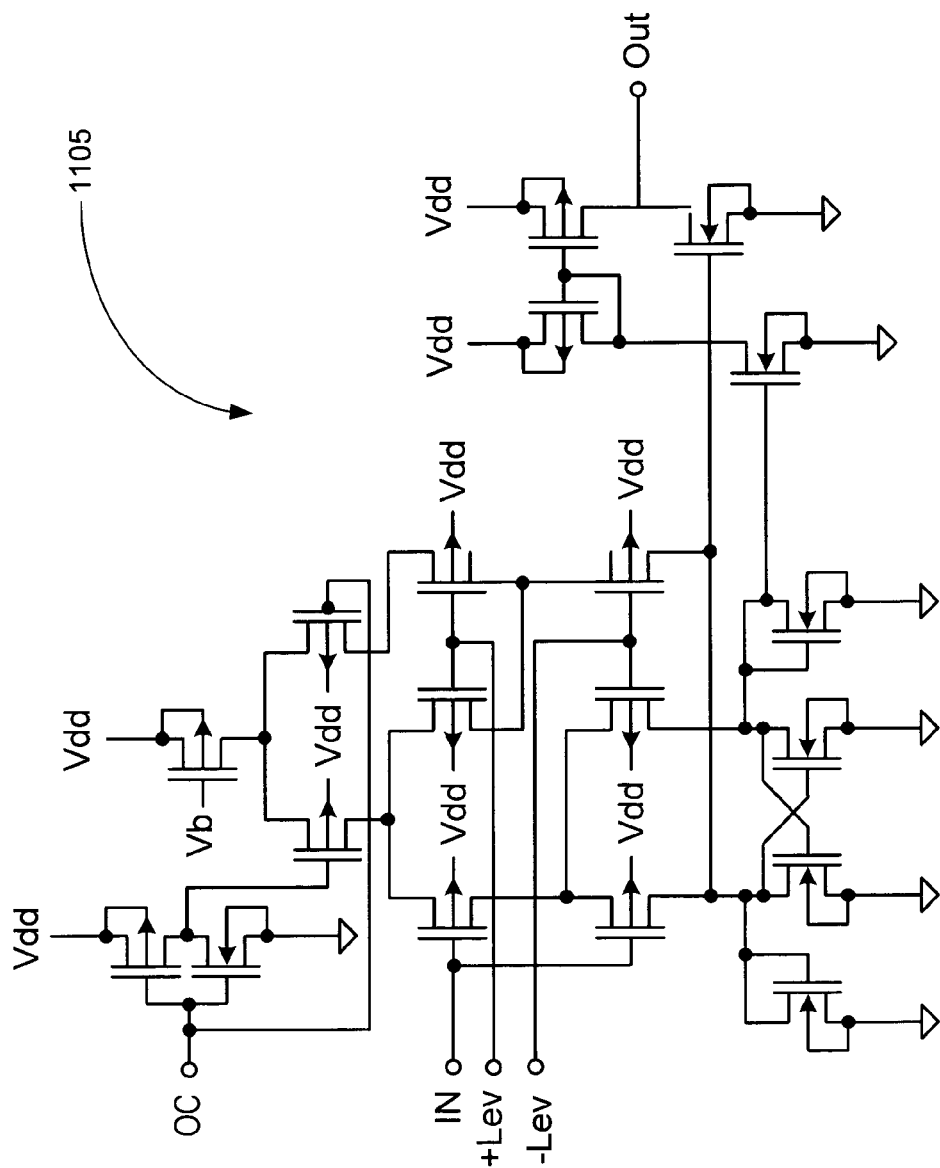
FIG. 12 is a schematic block diagram of an exemplary gated window detector for use with the data acquisition system of FIG. 3 to monitor the full bridge power stage circuit of FIG. 2.

FIG. 12 is a schematic diagram of one example of a gated window detector 1105 that may be used in the statistical fault sensor circuit 1100. In this example, the signal range of the output voltage ports to the window detector 1105 may be within the bounds of Vdd and ground. The window potentials may be bounded by nature since the attenuator ratios can be substantially identical for all attenuators. Vbat may have a transient component that results in clamping on the gate protection networks. As long as there are no errors other than saturation in this input, the transient component may be of no serious concern. In general, the operating range of the detector 1105 may be between the window potentials, well within the bounds of Vdd and ground.

The window half voltages produced across the resistors R1 and R2 shown in FIG. 11 may be approximately 20% of Vdd, such as 1V at full scale. The three bit digital-to-analog converters (DACs) that may linearly program this voltage may step from 1 to 8 units of current by gating three current sources that are symmetrically mirrored to form both upper and lower halves of the window. A fourth current source may provide one unit (LSB) of ungated current.

Intermittent faults can be diagnosed on the first level by using data that has been accumulated by counting overcurrent and overload events. FIGS. 13 through 16 illustrate exemplary implementations of registers that may be used to capture overcurrent and overload events for two channels. Since the output stage may provide current information that is power supply specific, it is possible to count the overload events associated with each supply.

Figure 17:
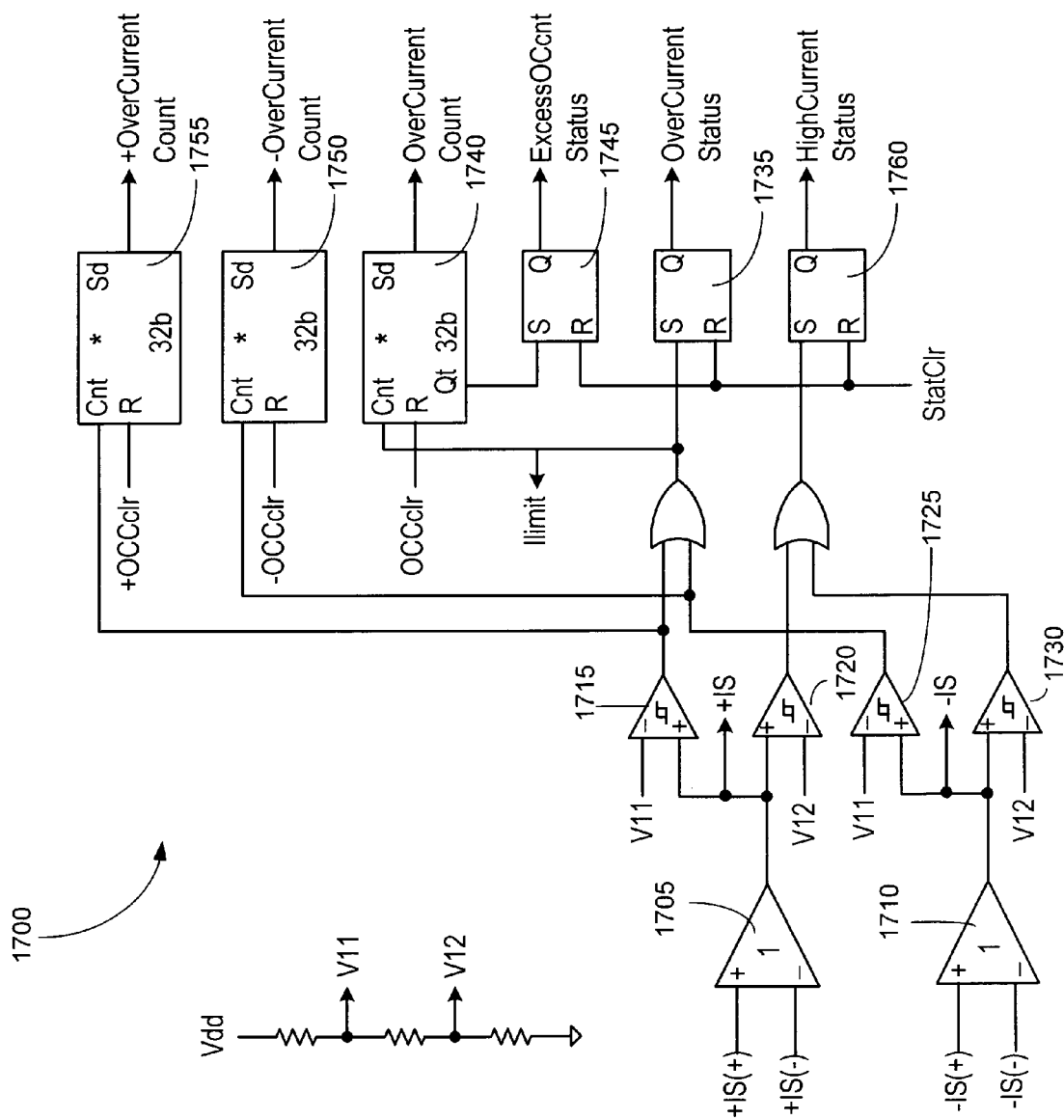
FIG. 17 is a schematic block diagram of an exemplary circuit for detecting overcurrent conditions that occur on a single power amplifier channel.

FIG. 17 is a schematic block diagram of an exemplary circuit 1700 for detecting overcurrent conditions that occur on a single power amplifier channel. Circuit 1700 may be used to implement the overcurrent detection channels 160 shown in FIG. 1. The output registers of circuit 1700 may be provided to registers arranged in a manner shown in FIGS. 13 through 16, which may be part of the system register storage 170 shown in FIG. 1.

As shown in FIG. 17, the current signal outputs of the full-bridge power stage +IS(+), +IS(−) and −IS(+), −IS(−) (shown in FIG. 2) may be received by differential receivers 1705 and 1710, respectively to form analog signals +IS, −IS, respectively. The +/−IS signals may be monitored with comparators 1715, 1720, 1725, 1730, and may be compared with one or more voltages. As shown in FIG. 17, +IS, −IS are compared with V11 and V12. V11 may represent a voltage at which an overload condition may occur. V12 may represent a voltage less than V11, but than may represent a voltage higher than expected for the normal operation of audio amplifier 115. If either +IS, −IS voltage level exceeds voltage V11, the signal Ilimit goes to an active state and the corresponding power amplifier channel may be inhibited from further operation. In one example, Ilimit is the OR of the overcurrent signals produced from both supplies. Any assertion of the Ilimit signal to an active state may set a latch, such as S/R flip-flop 1735, which represent the overcurrent signal (OC) and may be used to initiate an interrupt to the processor 175 if so desired. In addition, other comparisons may be performed that analyze higher than normal current (but not an overcurrent) in the circuit. For example, as described above, V12 may less than the value of V11, such as 80% of the value of V11. If either +IS, −IS voltage level exceeds voltage V12, a latch, such as S/R flip-flop 1760, may be set indicating a high current status. The high current status may be used as an interrupt to processor 175, indicating a potential problem in the audio amplifier 115.

The number of Ilimit events (including both negative and positive overcurrents) may be counted using an overcurrent counter 1740. The number of Ilimit events for negative overcurrents may be counted using an overcurrent counter 1750, and the number of Ilimit events for positive overcurrents may be counted using an overcurrent counter 1755.

The overcurrent counter 1740 may be tapped at point Qt. If the Qt count is ever reached, it may set a status latch, such as S/R flip-flop 1745, to indicate that an excessive number of overcurrent events have occurred. To this end, the setting of latch 1745 may be used to initiate an interrupt to indicate the occurrence of an excess number of overcurrent events to the processor 175. The value for Qt may be programmed or fixed. By setting the value for Qt to count a significant number of overcurrent events, it is possible to minimize the tendency to report systems as defective that have only encountered a single static glitch or a minor number of non-recurring errors. The reporting of false positives may be a major cause of annoyance to vehicle owners and may create needless service costs. When a fault is genuine, the rate of counting may be very high, often at the switching frequency of the output stage. This further improves the discrimination between actual faults and glitches in the system.

The system shown in FIG. 17 employs 32 bit counters and the switching frequency of the input signals may be about 250 KHz. When the counter saturates, it may cease further counting rather than allowing a roll-over error. With multiple overcurrent counters, such as positive supply overcurrent counter 1755, negative supply overcurrent counter 1750, and the total overcurrent counter 1740, as illustrated in the register configuration of FIGS. 13-16, it is possible to improve the accuracy of fault detection and to identify the source of the faults.

When a fault develops between a speaker lead and the vehicle chassis or ground, large magnitude signals may encounter overcurrent limiting whenever the voltage across the fault divided by the fault resistance reaches the current limit value. If the fault resistance is large, then the overcurrent events will be rare. Likewise if the signal level is low, the overcurrent events will be rare. Whenever the signals are large enough to produce overcurrent events, the positive and negative events can occur in time alternation which results in the overcurrent counter 1740 being equal in count to the sum of the positive and negative overcurrent counters 1755, 1750. If a large enough number of events occurs, the positive and negative counters 1755, 1750 may tend to have similar counts, i.e. half of the main overcurrent counter number 1740 will be in each of the polarity sensitive counters 1745 and 1750. This is true as long as positive signal peaks are as likely as negative peaks.

On the other hand, assume that a fault develops between a speaker lead and the battery. In this situation, it is more likely to have overcurrent events in the negative supply as compared to the positive supply. This is because the battery voltage adds to the difference potential between the speaker lead and the supply potential of the negative switch, whereas it diminishes the potential between the speaker lead and the supply potential of the positive switch. The main overcurrent counter 1740 is still likely to accumulate these counts in time alternation making the most probable value for that counter exactly equal to the sum of the positive and negative overcurrent counters 1755, 1750.

If a fault develops between speaker leads it is possible to have overcurrent simultaneously in both polarities of overcurrent. The more sensitive of the two limit currents will tend to dominate the individual polarity sensitive counters, but the lack of strict time alternation between counts can now result in the OR-ed count of register 1740 being less than the sum of the positive and negative overcurrent counters 1755, 1750. The polarity of the signal peaks may have little to do with the counts in this case by virtue of the output being a full-bridge power stage wherein both supplies contribute equally to either polarity of signal.

Channel-to-channel speaker lead faults may be readily identified as there may be overcurrent events recorded in the counters of more than one channel. Since overcurrent should be rare by design, to have multiple channels with overcurrent events can mean primarily one thing, i.e. the channels are inadvertently joined with one another. In this case, overcurrent events tend to be in time alternation and positive overcurrent events are as likely as negative overcurrent events.

In one example system, an I²C bus interface may read the overcurrent counters and poll the status register(s) that contain the status bits described in connection with FIG. 17. The act of reading the counters or the status register(s) may act to automatically clear the interrogated counter or status register. Any of the status bits can be mapped to one of two interrupt pins as programmed by interrupt mapping registers.

Ripple in Power Supply Currents to PWM Power Stages

Power supply currents to class-AB amplifiers at large output currents are simple rectified versions of the load current and can be easily monitored for magnitudes of load current. As long as the current being compared is well above the quiescent bias current levels of the class-AB aspects of the design, monitoring load current using supply currents is straight-forward.

Figure 19:
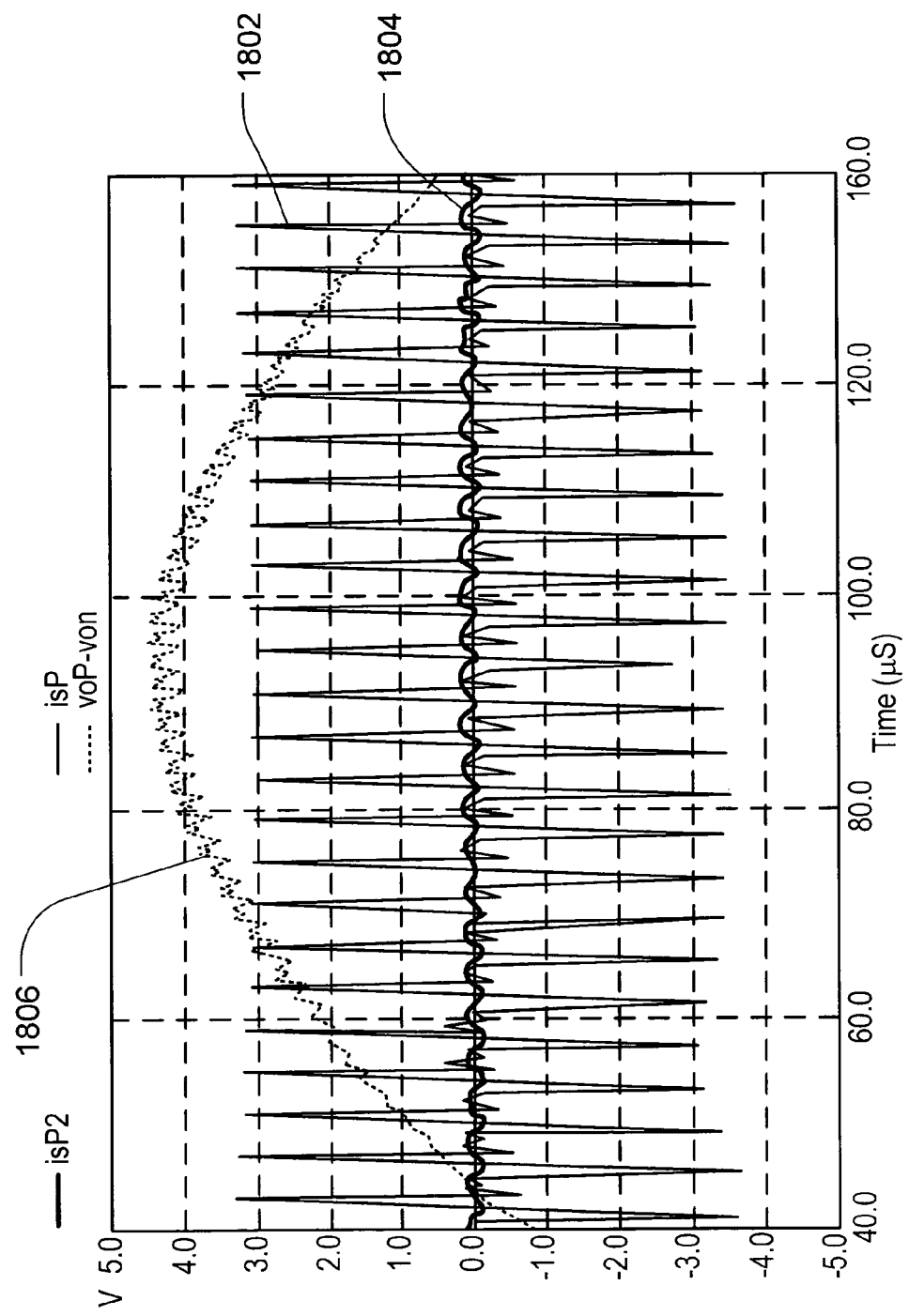
Figure 20:
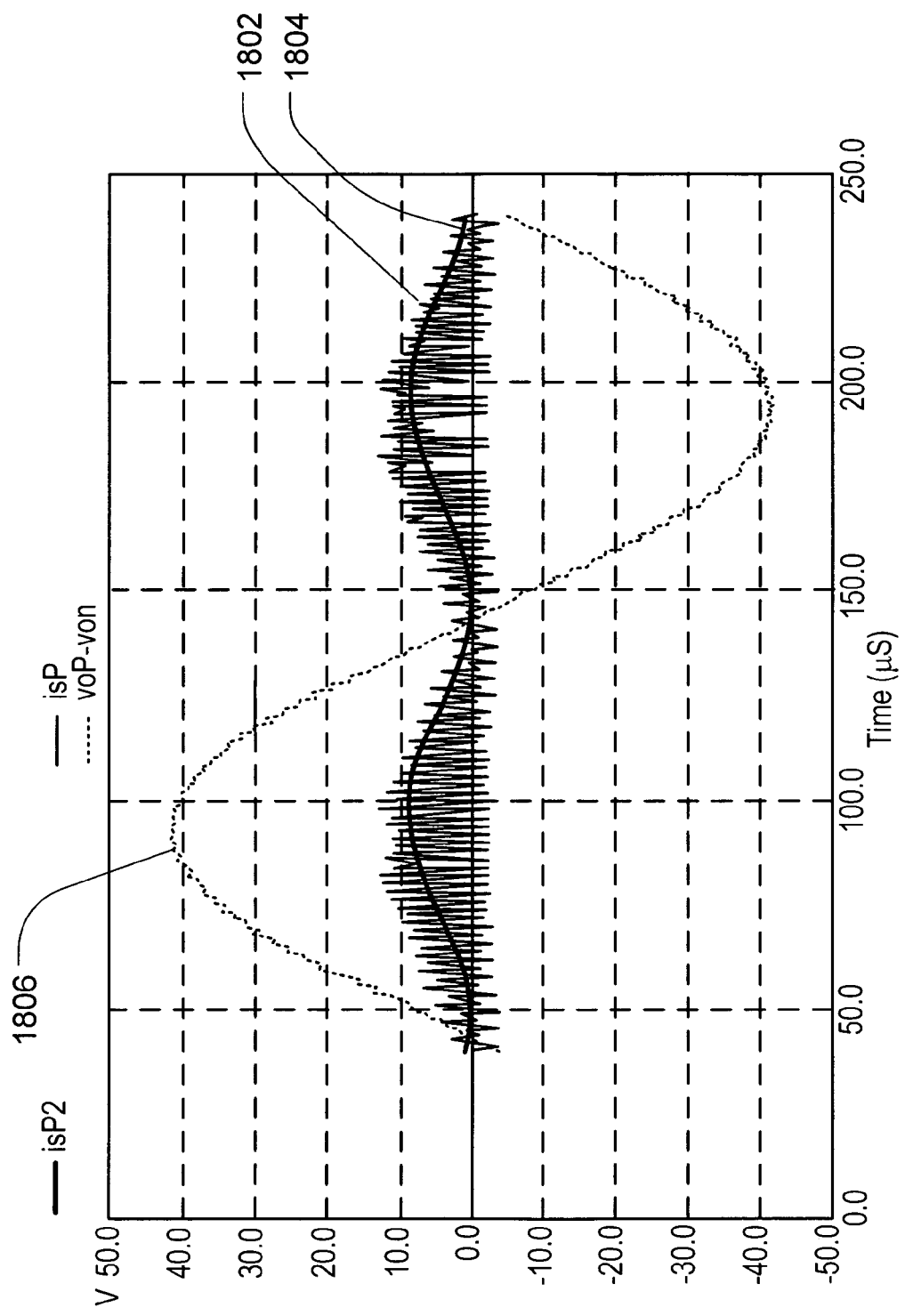
Figure 21:
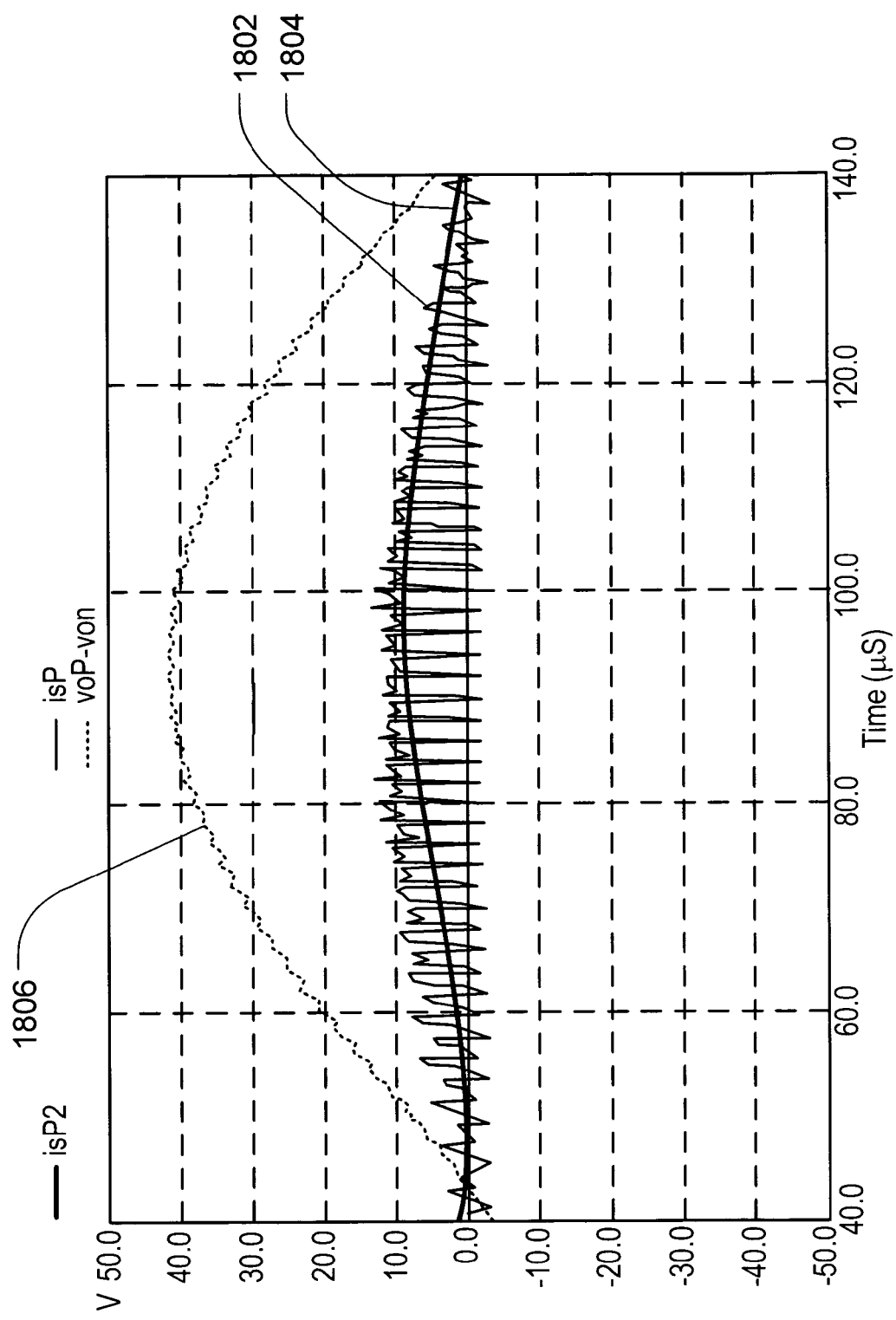

Switch-mode power stages circulate substantial currents in inductances that are used at the input to the output filter. These inductances receive the PWM switching waveforms of the power stage and create continuous currents that within the inductors ripple about the output load current with waveforms that are triangular in form. These same currents are switched between the power supply rails creating supply currents that are discontinuous. An example of the supply current to a full-bridge that is switching at 250 KHz with interleaved modulation at 5 KHz is shown in the waveforms of FIGS. 18-21. FIG. 19 is an exploded view of the waveforms shown in FIG. 18 to provide better view of the currents. In like manner FIG. 21 is an exploded view of the waveforms shown in FIG. 20.

Figure 18:
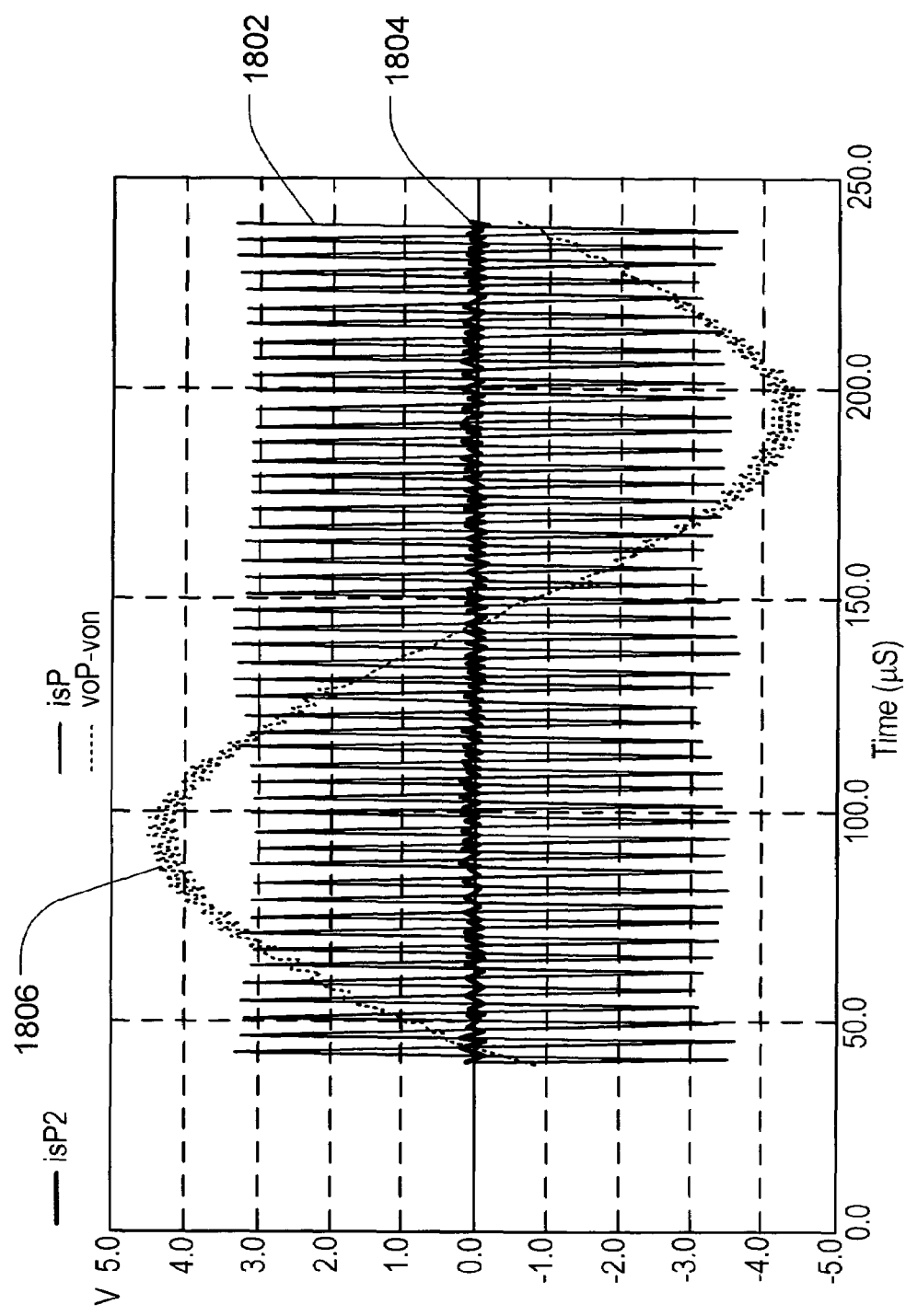
FIGS. 18-21 illustrate various waveforms that may occur in the full-bridge power amplifier channel shown in FIG. 2.

In FIG. 18, the >3 Apk current waveform 1802 is very large compared to the 20 KHz low-pass filtered supply current 1804. The actual load current is just over 1 Apk, but because the class-D power stage functions as a power converter, the actual peak load induced supply current is attenuated by the ratio of the output voltage divided by the supply voltage which in this case is 4.3/52.

The filtered output voltage is the sinusoidal waveform 1806. The waveform shows some small amount of distortion since this power converter is operating open loop in this test. The ripple on the sine wave is the part of the large 52 Vpk switching waveform that is not fully filtered in the output. As shown in FIG. 18, near zero, the ripple is very small as this is an interleaved full-bridge converter. In FIGS. 18 and 19, the waveform is modulating with a 0.1 modulation index, i.e. 20 dB below maximum level. In FIGS. 20 and 21, the waveform is operating with a 0.9 modulation index, i.e. 0.9 dB below maximum level.

The output voltage is now 41 Vpk resulting in a supply current attenuation factor of 41/52 and a clearly visible current signal when low-pass filtered by the 20 KHz low-pass filter. Were it not for the 20 KHz filter, the current waveform 1802 would be much more difficult to observe. A 41 Vpk corresponds to 210 W average power into a 4 Ohm load which is what is shown in this case. Exactly one cycle of 5 KHz is shown. The ripple on the peaks of the output voltage waveform 1806 is diminished from what is seen at 26V levels. This is the function of an interleave of two converter which has nulls in the output ripple at zero signal and peak signal. The power supply current waveforms of a switch-mode converter are filtered to allow judgments about load current. The output signal should be of substantial level so as to create substantial supply currents. This differs from the class-AB case. As such, a data acquisition system that provides data about load current from such signals may include a low-pass filter that has substantial attenuation at the switching frequency. The statistical diagnostics approach taken to counting overcurrent events can also be extended to counting all overload events which now adds the dimension of overvoltage (clipping) detection to the diagnostics hardware.

Figure 22:
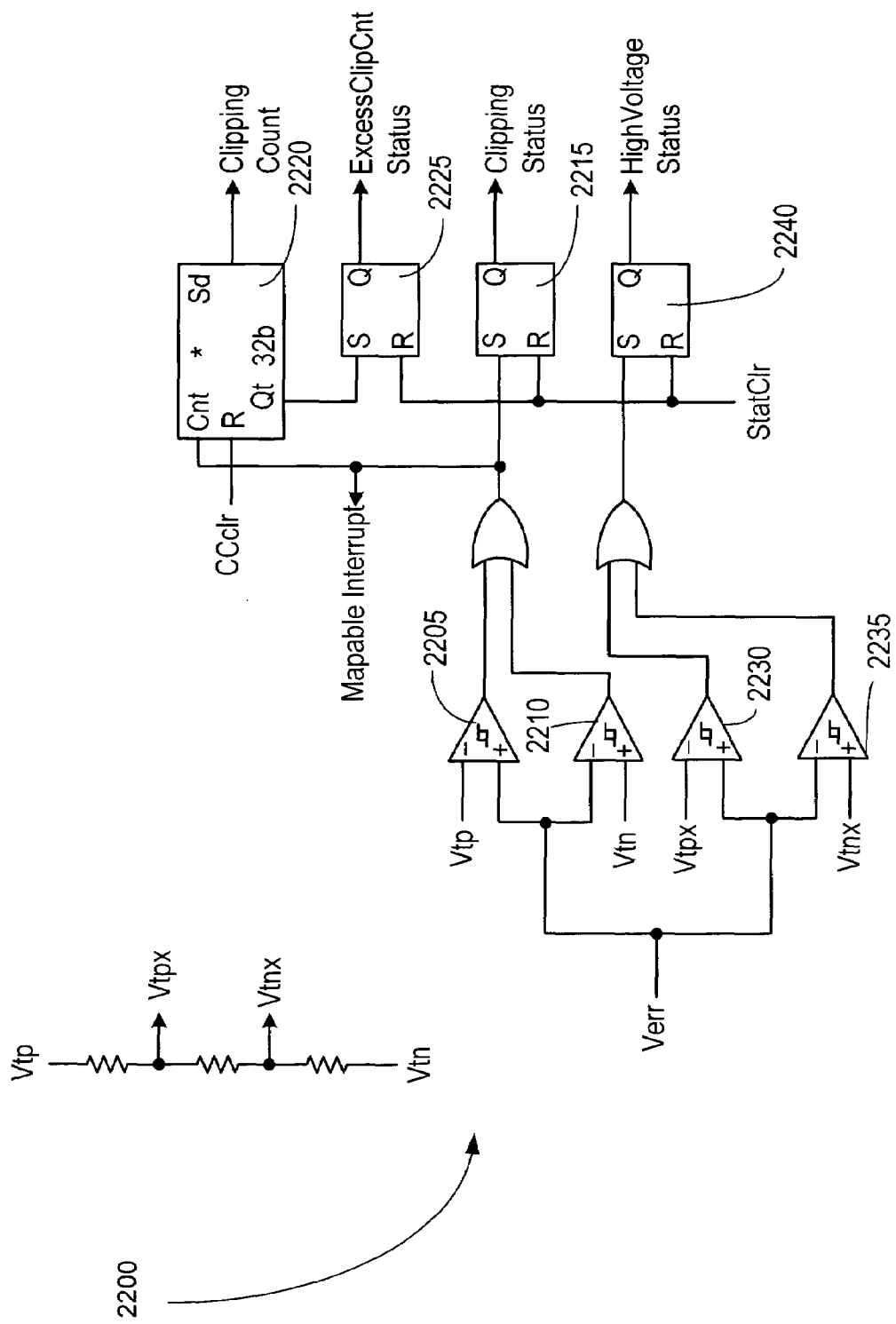

FIG. 22 is a schematic diagram of one example of an overvoltage detection circuit 2200 including its corresponding registers. Circuit 2200 may be used to implement the overvoltage detection channels 165 shown in FIG. 1. In circuit 2200, window comparators 2205 and 2210 are used to sense clipping. More particularly, clipping is sensed by using the window comparators 2205 and 2210 to compare the feedback error amplifier output Verr of the amplifier power channel to the available signal dynamics that are evident in the two voltages Vtp and Vtn. Vtp and Vtn are the peak signal voltages of the PWM modulating triangle waveform employed in the power amplifier channel and are used by the triangle generator 204 for amplitude control. Vtp and Vtn track the power supply voltages to the power output stage of the power amplifier channel. This method results in constant stage gain by using feed-forward control of the modulation. Any time that the error signal Verr goes beyond these limits, the modulator of the power amplifier channel is saturated and is in overload. This results in the setting of a status bit using, for example, S/R flip-flop 2215.

Actual overloads are counted in a clipping counter 2220. Any overload of major duration may be captured in this counter. Clipping conditions will result in errors within the amplifier feedback loop and can result in counting. The counting rate of counter 2220 may be well below the switching rate of the power amplifier channel since the error amplifier does not generally sense every switching event as an individual error. Rather, errors may extend over whole switching cycles. As such, the clipping counter 2220 may give another statistical perspective to the fault problem. The clipping counter 2220 may count the number of audio frequency clipping events rather than the number of switching cycles that were involved. When the clipping counter 2220 counts to a tap point Qt on the clipping counter, a status bit may be set using, for example, S/R flip-flop 2225. Tap point Qt of clipping counter 2220 need not be equal in value to the tap point Qt on the overcurrent counter 1740 of overcurrent detection circuit 1700. Since the clipping counter 2220 tends to count more slowly, it would not be useful if the two tap points were the same. In like manner to the excess count register 1740 of the overcurrent detection circuit 1700, the excess clipping counter 2225 may be used to interrupt the processor 175.

Having a high number of clip events in a properly programmed system should rarely occur. The output of the audio processor 110 should be maintained to keep the peak signal voltage beneath the available supply voltage unless the user is pushing the system 100 for all it can do at high level. Since the processor 175 is programmed to know the intended operating level and also may be in control of the amplifier power supply potentials, it can interpret whether the value counted by the clipping counter 2220 is proper for the operating conditions. Having a large number of clipping events with no apparent cause may be a symptom of a defective power amplifier channel. The implication is that the loop feedback is no longer in control of the power amplifier channel and the channel may need to be taken out of service with an unknown defect.

A second set of window comparator 2230 and 2235 use the error signal Verr and compare it to an attenuated set of voltages Vtpx and Vtnx to report large error signals that may not otherwise completely reach a clipping condition. By being attenuated from Vtp and Vtn, the attenuated set of voltages Vtpx and Vtnx track the triangle modulation signals at a sub maximum level. Any signal that exceeds this smaller predefined window may be used to set a high voltage status latch, such as S/R flip flop 2240. Additionally, signals that exceed the predefined window of Vtp and Vtn may be used to set the clipping status register 2215. The signal from the high voltage status latch 2240 is not an overload condition identifier. Rather, the inference of the use of this feature is that the level of the error signal Verr is larger than normally expected.

Responding to an Interrupt:

An interrupt system may be used while the system 100 is in use to detect faults as they appear. In one example, there may be N channel pairs of PWM amplifiers (2*N channels or 2*N−1 when MaxCh is odd) each pair having an $I_2C$ port with a status register. Each channel may have a status bit for overtemperature, temperature warning, overcurrent, high current, clipping, high output voltage, excess overcurrent events and excess clipping events. Excess events may be derived from counting events and when a predetermined count is exceeded, a status bit may be set. Clearing the associated counter could be required to clear the status bit. The act of reading the counter may clear the counter. Single event status bits may be cleared by reading the status register unless the condition persists, i.e. thermal.

An internal interrupt mask register may be used to associate each of the status bit with interrupt generation. (See FIGS. 9 and 10). This allows program control of what types of events are serviced on a channel-by-channel basis. If need be, the interrupt mask can be redefined dynamically. For example, the factory testing of the system 100 might be set to detect all of the possible causes for an interrupt whereas subsequent normal use, such as field use of the system 100, may be programmed to simply detect overtemperature, temperature warning, excess overcurrent events, and excess clipping events. An exemplary interrupt event service routine is shown in Appendix B. Further refinement in identifying the nature of intermittent faults is possible by using information derived from cross-correlating overcurrent events, clipping events, and instantaneous output voltage measurements.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A power converter system comprising:
   a power conversion circuit having a plurality of signals; and
   a diagnostic system that operates in a burst mode to execute multiple measurements indicative of a selected one of the plurality of signals during a burst cycle and that analyzes the multiple measurements, where the diagnostic system includes a data acquisition system adapted to provide a measured signal indicative of the selected signal, and where the data acquisition system comprises a memory storage, said memory storage further comprising a register that is programmable to select which of the plurality of signals are measured.

2. The power converter system of claim 1, further comprising a power amplification system, and where the power conversion circuit comprises a power amplification channel.

3. The power converter of claim 1, where the diagnostic system measures an attenuated signal corresponding to at least one of the plurality of signals.

4. The power converter system of claim 1, wherein the power conversion circuit comprises multiple audio amplification channels, and the data acquisition system multiplexes signals for at least two of the audio amplification channels for measurement.

5. The power converter system of claim 1, where the diagnostic system statistically analyzes the measured signal.

6. The power converter system of claim 1, where the diagnostic system analyzes the multiple measurements to determine a maximum value of the selected signal during the burst cycle.

7. The power converter system of claim 1, where the diagnostic system analyzes the multiple measurements to determine a minimum value of the selected signal during the burst cycle.

8. The power converter system of claim 1, where the diagnostic system analyzes the multiple measurements in order to determine an average of the selected signal during the burst cycle.

9. The power converter system of claim 1, where a duration of the burst cycle is programmable.

10. The power converter system of claim 1, where the power conversion circuit is a pulse width modulated audio amplifier.

11. The power converter system of claim 1, where the data acquisition system comprises:
an analog multiplexor receiving signals indicative of the plurality of signals for selective provision at an output of the analog multiplexor; and
an analog to digital converter to convert a signal corresponding to the output of the analog multiplexor to a digital value.

12. The power converter system of claim 11, further comprising a filter disposed in a signal path between the output of the analog multiplexor and an input of the analog to digital converter.

13. The power converter system of claim 1, where the data acquisition system memory storage further comprises an acquisition control register that is programmable to select which of the plurality of signals are to be selected for measurement.

14. The power converter system of claim 13, where the acquisition control register is further programmable to set a duration of the burst cycle.

15. The power converter system of claim 1, where the diagnostic system further comprises an overcurrent detection circuit that detects overcurrent events occurring on at least one of the plurality of signals.

16. The power converter system of claim 15, where the memory storage register of the data acquisition system comprises a total overcurrent count register to store a value corresponding to a total number of overcurrent events detected on the at least one of the plurality of signals.

17. The power converter system of claim 16, where the memory storage register of the data acquisition system further comprises:
a positive overcurrent count register to store a value corresponding to a total number of positive overcurrent events detected on the at least one of the plurality of signals; and
a negative overcurrent count register to store a value corresponding to a total number of negative overcurrent events detected on the at least one of the plurality of signals.

18. The power converter system of claim 16, where the memory storage register of the data acquisition system further comprises an excess overcurrent count signal for comparison with the total overcurrent count register to provide an indication of an occurrence of an excess number of overcurrent events.

19. The power converter system of claim 1, where the diagnostic system further comprises an overvoltage detection circuit to detect clipping events occurring on at least one of the plurality of signals.

20. The power converter system of claim 19, where the memory storage register of the data acquisition system comprises a total clipping count register to store a value corresponding to a total number of clipping events detected on the at least one of the plurality of signals.

21. The power converter system of claim 20, where the overvoltage detection circuit further comprises an excess clipping count signal arranged with respect to the total clipping count register to provide an indication of an occurrence of an excess number of clipping events.

22. The power converter system of claim 1, where the diagnostic system uses the analysis of the multiple measurements to diagnose a problem with the power converter.

23. The power converter system of claim 22, where the diagnostic system modifies operation of at least a part of the power conversion circuit based on the diagnosis of the problem.

24. A power converter system comprising:
an audio amplifier circuit having a plurality of signals; and
a diagnostic system comprising a data acquisition system to provide a measured signal corresponding to at least one of the plurality of signals, where the diagnostic system statistically analyzes the measured signal based on a comparison of the measured signal with a first signal corresponding to a battery voltage used to provide power for the audio amplifier, and comparison of the measured signal with a second signal corresponding to a ground voltage of the audio amplifier.

25. The power converter system of claim 24, where the diagnostic system statistically analyzes the measured signal indicative of when at least a part of the audio amplifier is saturated, and where the saturation of at least a part of the audio amplifier circuit comprises an overcurrent event.

26. The power converter system of claim 24, wherein the diagnostic system comprises window detectors for determining whether the measured signal is within a predetermined battery voltage window and within a predetermined ground voltage window.

27. The power converter system of claim 26, where the statistical analysis comprises counting a number of times when the measured signal is within the predetermined battery voltage window and within the predetermined ground voltage window.

28. The power converter system of claim 26, where the diagnostic system determines whether at least one of the plurality of signals is shorted to a battery or shorted to ground.

29. The power converter system of claim 25, where the statistical analysis comprises counting a number of overcurrent events.

30. The power converter system of claim 29, where the statistical analysis comprises counting positive and negative supply overcurrents separately.

31. A power converter system comprising:
a power conversion circuit having a plurality of signals;
a diagnostic system operating in a burst mode to execute multiple measurements indicative of a selected one of the plurality of signals during a burst cycle, and further operating to analyze the multiple measurements, where the diagnostic system includes a data acquisition system, and where the data acquisition system comprises an analog multiplexor receiving signals indicative of the plurality of signals for selective provision at an output of the analog multiplexor,
an analog to digital converter to convert a signal corresponding to the output of the analog multiplexor to a digital value, and
a filter disposed in a signal path between the output of the analog multiplexor and an input of the analog to digital converter.

32. A power converter system comprising:
a power conversion circuit having a plurality of signals; and
a diagnostic system operating in a burst mode to execute multiple measurements indicative of a selected one of the plurality of signals during a burst cycle, and further operating to analyze the multiple measurements, where the diagnostic system comprises an overcurrent detection circuit to detect overcurrent events occurring on the selected signal, and memory storage to store a value corresponding to a total number of overcurrent events detected on the selected signal.

33. The system of claim 32, where the memory storage comprises a total overcurrent count register.

34. The system of claim 33, where the memory storage register of the data acquisition system comprises:
a positive overcurrent count register to store a value corresponding to a total number of positive overcurrent events detected on the selected signal; and
a negative overcurrent count register to store a value corresponding to a total number of negative overcurrent events detected on the selected signal.

35. The system of claim 33, where the memory storage register of the data acquisition system further comprises an excess overcurrent count register adapted for comparison with the total overcurrent count register to provide an indication of an occurrence of an excess number of overcurrent events.

36. A power converter system comprising:
a power conversion circuit having a plurality of signals; and
a diagnostic system operating in a burst mode to execute multiple measurements indicative of a selected one of the plurality of signals during a burst cycle, the diagnostic system comprising a data acquisition system adapted to store a count of a number of times that the selected signal reaches a predetermined state, and where the diagnostic system is adapted to indicate an error of the selected signal by comparing the count with a predetermined count value.

* * * * *